US009245902B2

(12) United States Patent
Jeong

(10) Patent No.: US 9,245,902 B2
(45) Date of Patent: Jan. 26, 2016

(54) METHOD OF FABRICATING THREE-DIMENSIONAL SEMICONDUCTOR DEVICE

(71) Applicant: SAMSUNG ELECTRONICS CO., LTD., Suwon-si, Gyeonggi-do (KR)

(72) Inventor: Kil-Su Jeong, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/536,328

(22) Filed: Nov. 7, 2014

(65) Prior Publication Data

US 2015/0064867 A1    Mar. 5, 2015

Related U.S. Application Data

(62) Division of application No. 13/604,665, filed on Sep. 6, 2012, now Pat. No. 8,901,636.

(30) Foreign Application Priority Data

Sep. 7, 2011    (KR) .................. 10-2011-0090544

(51) Int. Cl.
| | | |
|---|---|---|
| *H01L 21/4763* | (2006.01) | |
| *H01L 21/336* | (2006.01) | |
| *H01L 27/115* | (2006.01) | |
| *H01L 27/06* | (2006.01) | |
| *H01L 27/10* | (2006.01) | |
| *H01L 29/792* | (2006.01) | |

(52) U.S. Cl.
CPC ...... *H01L 27/11582* (2013.01); *H01L 27/0688* (2013.01); *H01L 27/101* (2013.01); *H01L 27/11556* (2013.01); *H01L 29/7926* (2013.01)

(58) Field of Classification Search
CPC .................. H01L 27/11551; H01L 27/11578; H01L 27/0688
USPC .......... 257/324, 321, 319, E27.098, E29.255, 257/E21.294, 316, E29.309; 365/185.05; 438/591, 257, 264
See application file for complete search history.

(56) References Cited

U.S. PATENT DOCUMENTS

| | | | | |
|---|---|---|---|---|
| 8,344,385 | B2 * | 1/2013 | Kim .................. | H01L 27/11582 257/326 |
| 2010/0078701 | A1 | 4/2010 | Shim et al. | |
| 2011/0032772 | A1 | 2/2011 | Aritome | |
| 2011/0147824 | A1 * | 6/2011 | Son ..................... | G11C 16/0483 257/324 |
| 2011/0233648 | A1 | 9/2011 | Seol et al. | |
| 2011/0316064 | A1 | 12/2011 | Kim et al. | |
| 2012/0003828 | A1 * | 1/2012 | Chang ............... | H01L 27/11582 438/591 |
| 2012/0205722 | A1 * | 8/2012 | Lee ..................... | H01L 27/1157 257/211 |

* cited by examiner

*Primary Examiner* — Julio J Maldonado
*Assistant Examiner* — Cory Eskridge
(74) *Attorney, Agent, or Firm* — Lee & Morse, P.C.

(57) ABSTRACT

A three-dimensional semiconductor device and a method of fabricating the same, the device including a lower insulating layer on a top surface of a substrate; an electrode structure sequentially stacked on the lower insulating layer, the electrode structure including conductive patterns; a semiconductor pattern penetrating the electrode structure and the lower insulating layer and being connected to the substrate; and a vertical insulating layer interposed between the semiconductor pattern and the electrode structure, the vertical insulating layer crossing the conductive patterns in a vertical direction and being in contact with a top surface of the lower insulating layer.

6 Claims, 20 Drawing Sheets

METHOD OF FABRICATING THREE-DIMENSIONAL SEMICONDUCTOR DEVICE

CROSS-REFERENCE TO RELATED APPLICATION

This is a divisional application based on pending application Ser. No. 13/604,665, filed Sep. 6, 2012, the entire contents of which is hereby incorporated by reference.

Korean Patent Application No. 10-2011-0090544, filed on Sep. 7, 2011, in the Korean Intellectual Property Office, and entitled "Three-Dimensional Semiconductor Device and Method of Fabricating the Same" is hereby incorporated by reference in its entirety.

BACKGROUND

1. Field

Embodiments relate to a three-dimensional semiconductor device and a method of fabricating the same.

2. Description of the Related Art

Higher integration of semiconductor devices may be helpful to satisfy consumer demands for superior performance and inexpensive prices. In semiconductor devices, integration is an important factor in determining product prices. Thus, increased integration is especially desirable. In the case of two-dimensional or planar semiconductor memory devices, integration may be mainly determined by an area occupied by a unit memory cell and integration may be greatly influenced by a level of a fine pattern forming technology. However, extremely expensive process equipment may be needed to increase pattern fineness and thus may present a practical limitation on increasing integration for two-dimensional or planar semiconductor devices.

SUMMARY

Embodiments are directed to a three-dimensional semiconductor device and a method of fabricating the same.

The embodiments may be realized by providing a three-dimensional semiconductor device including a lower insulating layer on a top surface of a substrate; an electrode structure sequentially stacked on the lower insulating layer, the electrode structure including conductive patterns; a semiconductor pattern penetrating the electrode structure and the lower insulating layer and being connected to the substrate; and a vertical insulating layer interposed between the semiconductor pattern and the electrode structure, the vertical insulating layer crossing the conductive patterns in a vertical direction and being in contact with a top surface of the lower insulating layer.

Horizontal distances between the semiconductor pattern and the conductive patterns may be substantially uniform, independent of vertical positions of the conductive patterns.

The conductive patterns may be formed of a same conductive material.

A thickness of a region of the lower insulating layer underlying the vertical insulating layer may be smaller than a thickness of a region of the lower insulating layer underlying the conductive patterns.

The electrode structure may further include interlayer dielectrics interposed between vertically adjacent conductive patterns; and a horizontal insulating layer interposed between the vertical insulating layer and the conductive patterns, the horizontal insulating layer extending laterally to cover top and bottom surfaces of the conductive patterns.

A thickness of the lower insulating layer may be smaller than thicknesses of the interlayer dielectrics.

One of the vertical insulating layer and the horizontal insulating layer may include a data storing layer.

The semiconductor pattern may include a first semiconductor pattern on the top surface of the lower insulating layer; and a second semiconductor pattern in direct contact with both the first semiconductor pattern and the substrate, the second semiconductor pattern connecting the first semiconductor pattern with the substrate.

A portion of the vertical insulating layer may extend between the lower insulating layer and a bottom surface of the first semiconductor pattern.

The embodiments may also be realized by providing a method of fabricating a three-dimensional semiconductor device, the method including sequentially forming a lower insulating layer and a first sacrificial layer on a substrate; forming a layer stack on the first sacrificial layer such that the layer stack includes alternately stacked interlayer dielectrics and second sacrificial layers, the interlayer dielectrics and the second sacrificial layers having an etch selectivity with respect to the first sacrificial layer; patterning the layer stack to form a trench exposing the first sacrificial layer; selectively removing the second sacrificial layers exposed by the trench to form upper recess regions between the interlayer dielectrics; selectively removing the first sacrificial layer exposed by the trench to form a lower recess region between the lower insulating layer and a lowermost one of the interlayer dielectrics; and forming conductive patterns in the lower and upper recess regions.

The method may further include, prior to forming the trench, forming an opening that penetrates the layer stack and the first sacrificial layer and exposes the lower insulating layer; sequentially forming a vertical insulating layer and a first semiconductor layer to cover an inner wall of the opening; and forming a second semiconductor layer penetrating the first semiconductor layer, the vertical insulating layer, and the lower insulating layer at a bottom of the opening such that the second semiconductor layer is connected to the substrate.

The first sacrificial layer may be formed of a substantially same material as the first and second semiconductor layers.

The upper and lower recess regions may partially expose a sidewall of the vertical insulating layer.

Forming the lower recess region may expose a top surface of the lower insulating layer.

The method may further include, prior to forming the conductive patterns, conformally forming a horizontal insulating layer in the lower and upper recess regions.

The embodiments may also be realized by providing a three-dimensional semiconductor device including a substrate; a lower insulating layer on a top surface of the substrate; an electrode structure on the lower insulating layer, the electrode structure including alternately stacked conductive patterns and interlayer dielectrics; a semiconductor pattern penetrating the electrode structure and the lower insulating layer, the semiconductor pattern being connected to the substrate; and a vertical insulating layer interposed between the semiconductor pattern and the electrode structure, the vertical insulating layer extending along sides of the alternately stacked conductive patterns and interlayer dielectrics in a direction perpendicular to a plane of the top surface of the substrate, and contacting a top surface of the lower insulating layer.

A thickness of a region of the lower insulating layer underlying the vertical insulating layer may be smaller than a thickness of a region of the lower insulating layer underlying the conductive patterns.

The electrode structure may further include a horizontal insulating layer interposed between the vertical insulating layer and the conductive patterns, the horizontal insulating layer extending laterally to cover top and bottom surfaces of the conductive patterns.

One of the vertical insulating layer and the horizontal insulating layer may include a data storing layer.

The semiconductor pattern may include a first semiconductor pattern on the top surface of the lower insulating layer; and a second semiconductor pattern directly contacting both the first semiconductor pattern and the substrate, the second semiconductor pattern connecting the first semiconductor pattern with the substrate, and a portion of the vertical insulating layer may extend between the lower insulating layer and a bottom surface of the first semiconductor pattern.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
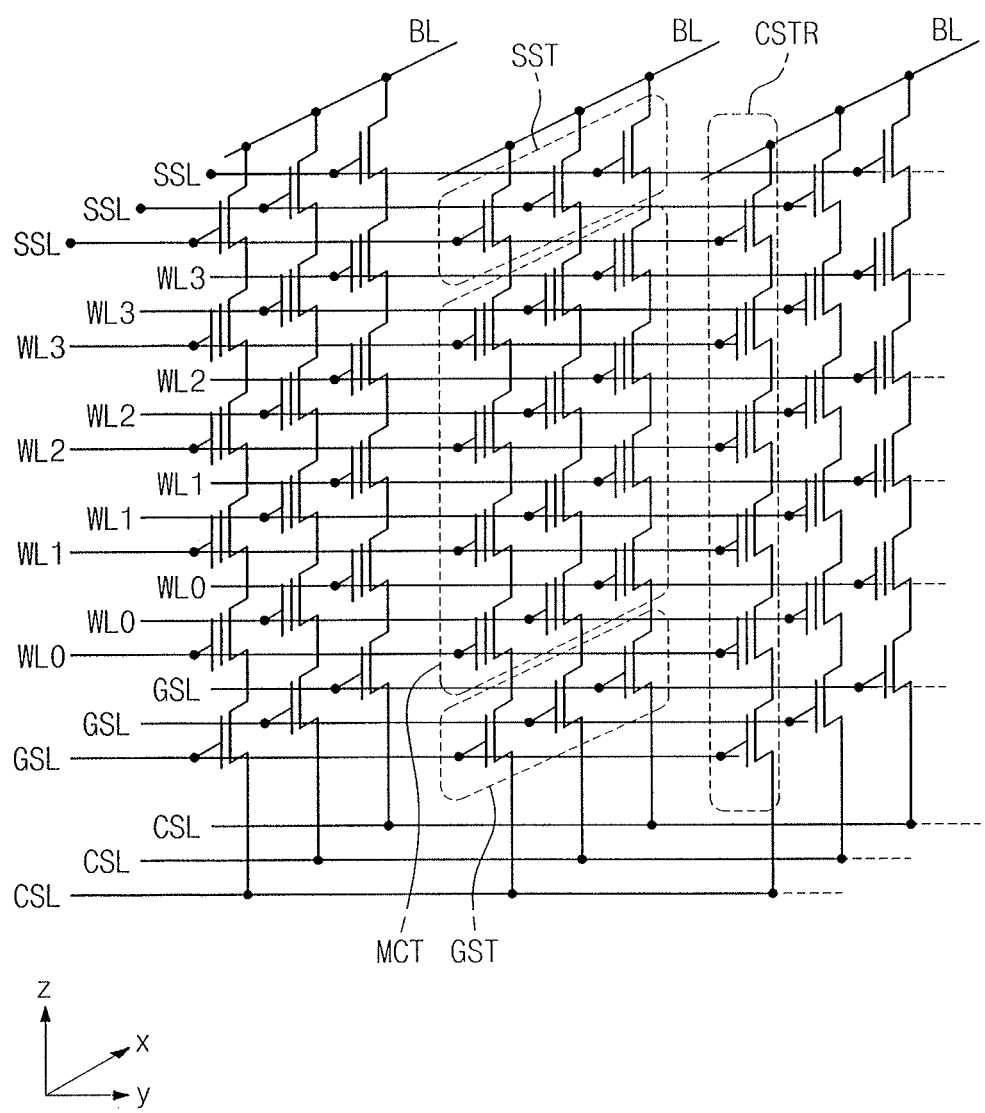
FIG. 1 illustrates a schematic circuit diagram of a three-dimensional semiconductor device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element is referred to as being "connected" or "coupled" to or with another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
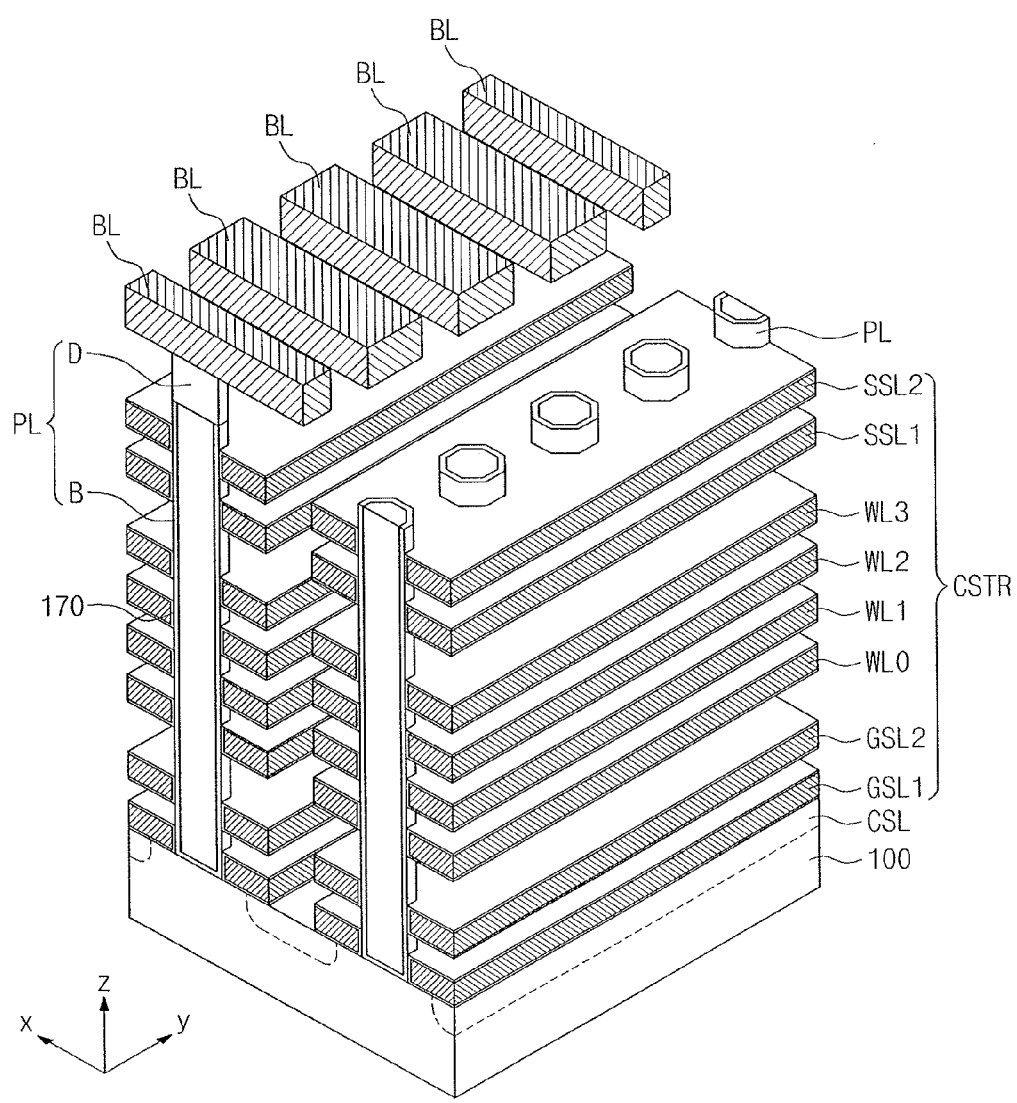
FIG. 2 illustrates a perspective view of a three-dimensional semiconductor device according to an embodiment.

FIG. 1 illustrates a schematic circuit diagram of a three-dimensional semiconductor device according to an embodiment. FIG. 2 illustrates a perspective view of a three-dimensional semiconductor device according to an embodiment.

Referring to FIG. 1, a three-dimensional semiconductor memory device may include a cell array region, in which a common source line CSL, a plurality of bit lines BL, and a plurality of cell strings CSTR (interposed between the common source line CSL and the bit lines BL) may be disposed.

The bit lines BL may be two-dimensionally arranged, and the plurality of cell strings CSTR may be connected in parallel to each of the bit lines BL. The cell strings CSTR may be connected in common to the common source line CSL. For example, the plurality of cell strings CSTR may be disposed between the common source line CSL and one of the bit lines BL. In an implementation, the cell array region may include a plurality of two-dimensionally arranged common source lines CSL. In an implementation, the common source lines CSL may be connected with each other and may be in an equipotential state. In an implementation, the common source lines CSL may be separated from each another such that they can be controlled independently.

Each of the cell strings CSTR may include a ground selection transistor GST (coupled with the common source line CSL), a string selection transistor SST (coupled with the bit line BL), and a plurality of memory cell transistors MCT (disposed between the ground and string selection transistors GST and SST). The ground selection transistor GST, the memory cell transistors MCT, and the string selection transistor SST may be connected in series.

Source regions of the ground selection transistors GST may be connected in common to the common source line CSL. In addition, at least one ground selection line GSL, a plurality of word lines WL0 to WL3, and a plurality of string selection lines SSL may be disposed between the common source line CSL and the bit lines BL to serve as gate electrodes of the ground selection transistor GST, the memory cell transistors MCT, and the string selection transistors SST, respectively. Furthermore, each of the memory cell transistors MCT may include a data storage element or a data storing layer.

Referring to FIG. 2, the common source line CSL may be a conductive layer disposed on a substrate 100 or a doped region formed in the substrate 100. The bit lines BL may be conductive patterns (e.g., metal lines) spaced apart from a top surface of the substrate 100. The bit lines BL may be two-dimensionally arranged over the substrate 100, and a plurality of the cell strings CSTR may be connected in parallel to, e.g., each of, the bit lines BL. Accordingly, the cell strings CSTR may be two-dimensionally arranged on the common source line CSL or the substrate 100.

Each of the cell strings CSTR may include a plurality of ground selection lines GSL1 and GSL2, a plurality of the word lines WL0 to WL3, and a plurality of string selection lines SSL1 and SSL2, which may be interposed between the common source line CSL and the bit lines BL. In an implementation, the string selection lines SSL1 and SSL2 may form the string selection line SSL of FIG. 1, and the ground selection lines GSL1 and GSL2 may form the ground selection line GSL of FIG. 1. In an implementation, the ground selection lines GSL1 and GSL2, the word lines WL0 to WL3 and the string selection lines SSL1 and SSL2 may be formed of conductive materials.

Each of the cell strings CSTR may include a semiconductor pillar (PL) or a vertical semiconductor pattern, which may extend from the common source line CSL or substrate 100 to a corresponding one of the bit lines BL in a vertical direction, e.g., a z-direction in FIG. 2. For example, the semiconductor pillar (PL) or vertical semiconductor pattern may extend perpendicularly relative to a plane of an upper surface of the substrate 100. The semiconductor pillars PL may penetrate the ground selection lines GSL1 and GSL2, the word lines WL0 to WL3, and the string selection lines SSL1 and SSL2. For example, a plurality of the conductive patterns stacked on the substrate 100 may be penetrated by the semiconductor pillars PL. In an implementation, each of the semiconductor pillars PL may include a body portion B and at least one doped region D at one end portion or both end portions of the body portion B. For example, the doped region D (serving as a drain region) may be in a top region of the semiconductor pillar PL or between the body portion B and the bit line BL.

A data storing layer 170 may be provided between the word lines WL0 to WL3 and the semiconductor pillars PL. In an implementation, the data storing layer 170 may be a layer capable of storing electric charges. For example, the data storing layer 170 may include one of a charge trap insulating layer, a floating gate electrode, or an insulating layer including conductive nanodots. In the case in which the data storing layer 170 includes the charge storing layer, data stored therein may be changed using Fowler-Nordheim (FN) tunneling, which may be caused by a voltage difference between the corresponding pair of the semiconductor pillars PL and the word lines WL0 to WL3. In an implementation, the data storing layer 170 may be formed of a material capable of storing data based on other writing principles. For example, the data storing layer 170 may include a material having a variable resistance property or a phase changeable property.

A dielectric, which may serve as a gate insulating layer of a transistor, may be interposed between the ground selection lines GSL1 and GSL2 and the semiconductor pillar PL and/or between the string selection lines SSL1 and SSL2 and the semiconductor pillar PL. In an implementation, the dielectric may be formed of a same material as the data storing layer 170 or of a silicon oxide used for a gate insulating layer of the conventional metal-oxide-silicon field-effect transistor (MOSFET).

In an implementation, the semiconductor pillars PL may constitute a MOSFET, along with the ground selection lines GSL1 and GSL2, the word lines WL0 to WL3, and the string selection lines SSL1 and SSL2. For example, the semiconductor pillar PL may serve as a channel region of the MOSFET, and the ground selection lines GSL1 and GSL2, the word lines WL0 to WL3, and the string selection lines SSL1 and SSL2 may serve as gate electrodes of MOSFETs.

In an implementation, the semiconductor pillar PL may constitute MOS capacitors along with the ground selection lines GSL1 and GSL2, the word lines WL0 to WL3, and the string selection lines SSL1 and SSL2.

Energy band structures of the semiconductor pillars PL may be controlled by voltages applied to the ground selection lines GSL1 and GSL2, the word lines WL0 to WL3, and the string selection lines SSL1 and SSL2.

For example, portions of the semiconductor pillars PL adjacent to the word lines WL0 to WL3 may be in an inversion state due to the voltages applied to the word lines WL0 to WL3. In addition, e.g., other portions of the semiconductor pillars PL between the word lines WL0 to WL3 may also be in an inversion state due to a fringe field generated from the word lines WL0 to WL3. In an implementation, the word lines WL0 to WL3 and the string selection lines SSL1 and SSL2 may be formed closely in such a way that additional inversion regions induced by the fringe field may be overlapped with each other. In this case, depending on voltages applied to the lines GSL1, GSL2, SSL1, SSL2, and WL0 to WL3, the inversion regions may be vertically overlapped with each other, such that the common source line CSL may be electrically connected to a selected bit line.

For example, the cell string CSTR may be configured to have a circuit structure, in which the selection transistors GST and SST (e.g., ground and string selection transistors including the lower and upper selection lines GSL1, GSL2, SSL1, and SSL2) and the memory cell transistors (e.g., MCT), shown in FIG. 1, are electrically connected in series.

Hereinafter, a method of fabricating a three-dimensional semiconductor device according to an embodiment will be described with reference to FIGS. 3 through 13. FIGS. 3 through 12 illustrate sectional views of stages in a method of fabricating a three-dimensional semiconductor memory device according to an embodiment. FIG. 13 illustrates an enlarged sectional view of a portion A of FIG. 12.

Figure 3:
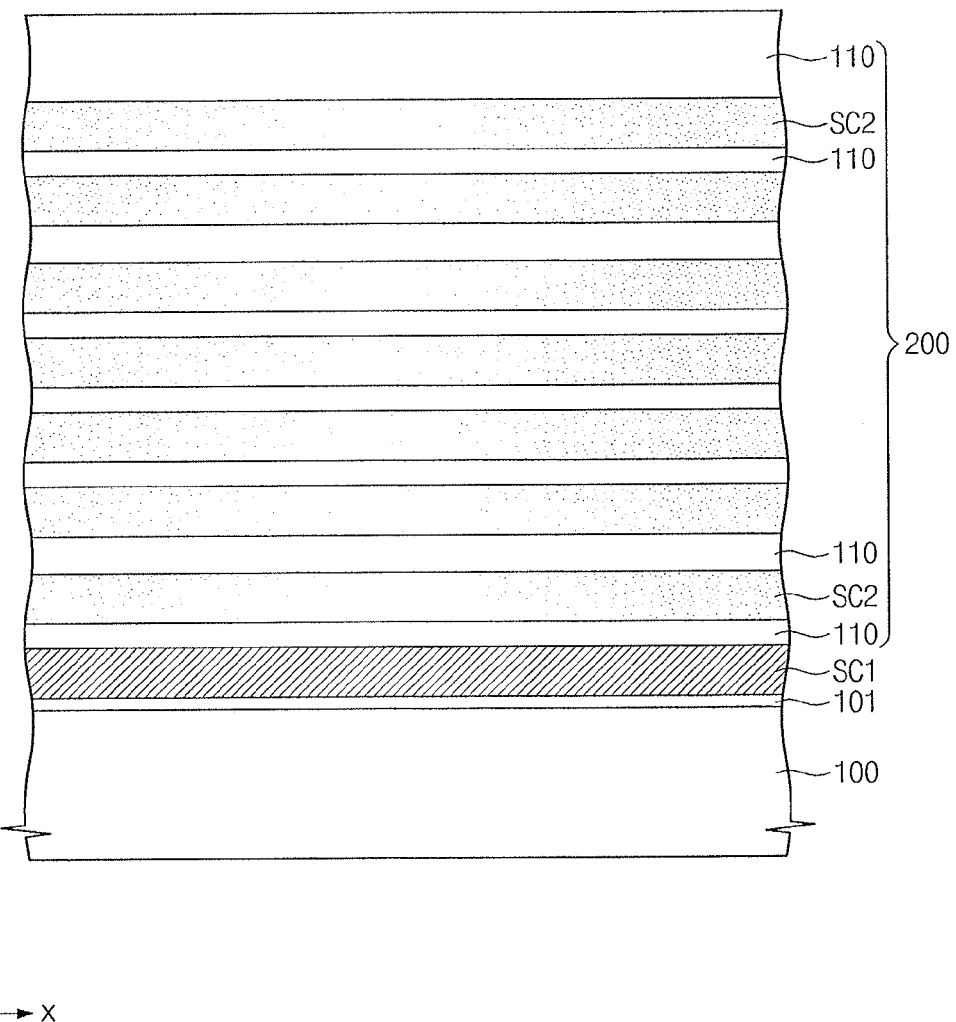
FIGS. 3 through 12 illustrate sectional views of stages in a method of fabricating a three-dimensional semiconductor memory device according to an embodiment.

Referring to FIG. 3, a lower insulating layer 101 and a first sacrificial layer SC1 may be stacked on a substrate 100.

The substrate 100 may be or may include one of a semiconductor substrate (e.g., a silicon wafer), an insulating substrate (e.g., a glass), or a conductive or semiconductor substrate covered with an insulating material.

The lower insulating layer 101 may be formed of an insulating material (e.g., a silicon oxide layer formed by a thermal oxidation process or a deposition process).

The lower insulating layer 101 may have a thickness smaller than that of the first sacrificial layer SC1 disposed thereon. For example, the lower insulating layer 101 may have a thickness of about 10 Å to about 300 Å. In an implementation, by virtue of the lower insulating layer 101, it is possible to prevent the substrate 100 from being damaged during a subsequent process of forming an opening 120 (see FIG. 4) through the first sacrificial layer SC1. In addition, the lower insulating layer 101 may help suppress formation of defects on a surface of the substrate 100 and may help relieve stress between the first sacrificial layer SC1 and the substrate 100.

The first sacrificial layer SC1 may be formed of a material having an etch selectivity with respect to the lower insulating layer 101. In an implementation, the first sacrificial layer SC1 may be formed of at least one of a silicon layer (e.g., a polysilicon layer, a single-crystalline silicon layer, or an amorphous silicon layer), a silicon oxide layer, a silicon germanium layer, a silicon carbide layer, a silicon oxynitride layer, or a silicon nitride layer. For the sake of simplicity, the description that follows will refer to an example of the present embodiment in which the first sacrificial layer SC1 is a polysilicon layer.

Then, a layer stack 200 may be formed on the first sacrificial layer SC1. The layer stack 200 may include a plurality of layers having an etch selectivity with respect to the first sacrificial layer SC1. In an implementation, the layer stack 200 may include a plurality of interlayer dielectrics 110 and a plurality of second sacrificial layers SC2. The interlayer dielectrics 110 and the second sacrificial layer SC2 may be alternately stacked on the lower insulating layer 101 and the first sacrificial layer SC1, as show in FIG. 3.

The second sacrificial layers SC2 may be formed of a material having an etch selectivity with respect to the first sacrificial layer SC1 and the interlayer dielectrics 110. For example, the second sacrificial layer SC2 may be formed of a material that is removed at a slower rate than materials of the first sacrificial layer SC1 and the interlayer dielectrics 110 during a subsequent process of etching the second sacrificial layer SC2. The etch selectivity may be quantitatively expressed as a ratio of an etch rate of a material of the second sacrificial layer SC2 to a material of the first sacrificial layer SC1 or the interlayer dielectrics 110. In an implementation, the second sacrificial layer SC2 may be or may include a material having an etch selectivity of about 1:10 to about 1:200 (e.g., about 1:30 to about 1:100) with respect to the first sacrificial layer SC1 or the interlayer dielectrics 110.

The second sacrificial layers SC2 may be formed of at least one of silicon, silicon oxide, silicon carbide, silicon oxynitride or silicon nitride, which may be different from the first sacrificial layer SC1 and/or the interlayer dielectrics 110. The interlayer dielectrics 110 may be formed of at least one of silicon, silicon oxide, silicon carbide, silicon oxynitride or silicon nitride, which may be different the first and second sacrificial layers SC1 and SC2. In an implementation, the second sacrificial layers SC2 may be formed of silicon nitride, and the interlayer dielectrics 110 may be formed of silicon oxide. For the sake of simplicity, the description that follows will refer to an example of the present embodiment in which the second sacrificial layers SC2 are formed of silicon nitride and the interlayer dielectrics 110 are formed of silicon oxide.

In an implementation, thicknesses of the first and second sacrificial layers SC1 and SC2 may determine channel lengths of the string and ground selection transistors SST and GST and the memory cell transistors MCT, described with reference to FIG. 1. The interlayer dielectrics 110 may be formed in such a way that the inversion regions induced by the fringe field may be vertically overlapped with each other.

In an implementation, the first and second sacrificial layers SC1 and SC2 may have a substantially same thickness. In an implementation, the first sacrificial layer SC1 may have a thickness greater than thicknesses of the second sacrificial layers SC2. The interlayer dielectrics 110 may be formed in such a way that one thereof has a different thickness from others thereof, as shown in FIG. 3. However, the embodiments are not limited thereto. For example, thicknesses of the interlayer dielectrics 110 may be variously modified from those depicted in FIG. 3, and a number of the layers constituting the layer stack 200 may be variously modified from that depicted in FIG. 3.

Figure 4:
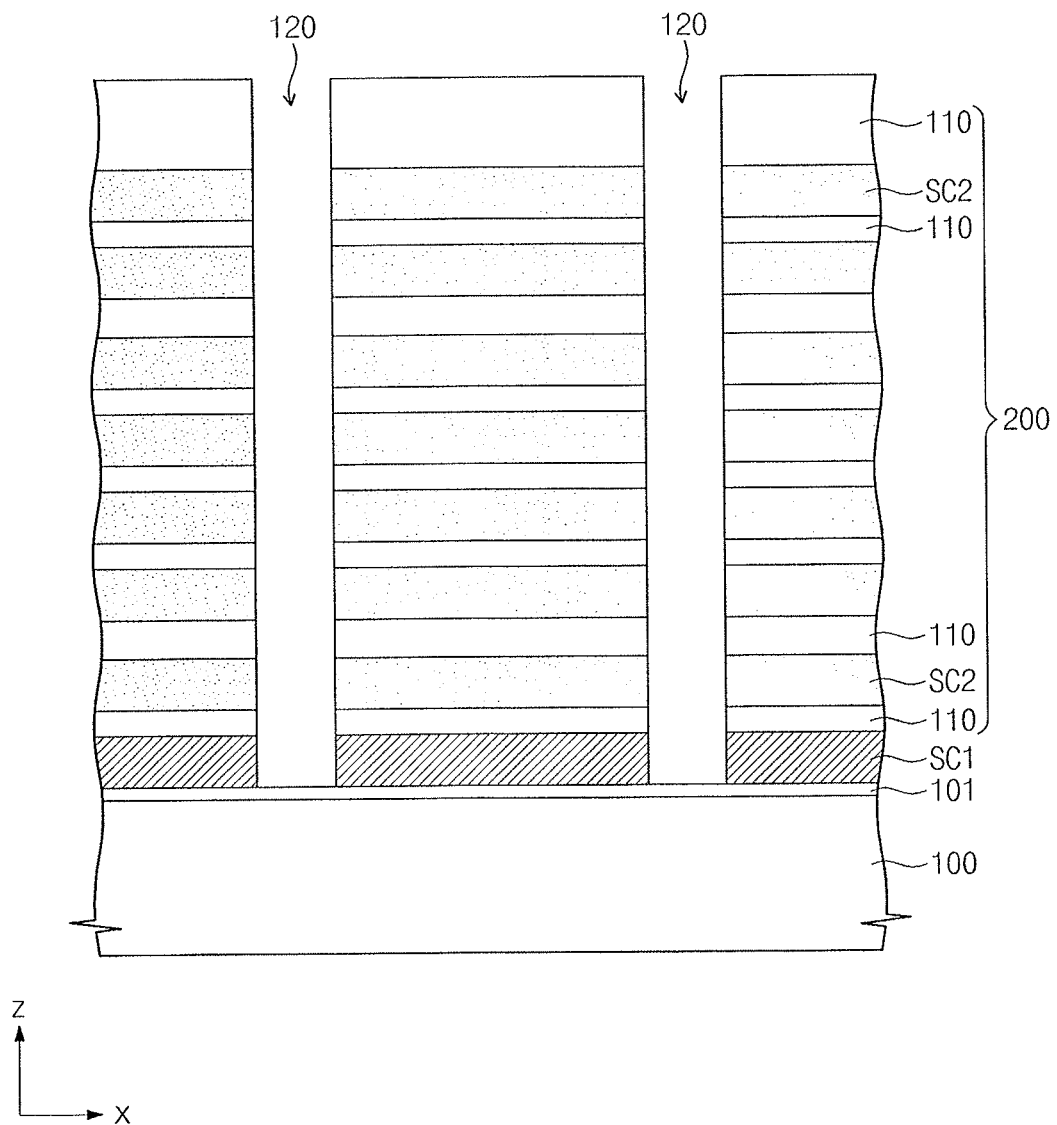

Referring to FIG. 4, openings 120 may be formed to penetrate the layer stack 200 and the first sacrificial layer SC1 and expose the lower insulating layer 101.

In an implementation, the formation of the openings 120 may include forming a mask pattern (not shown) on the layer stack 200 to define planar positions of the openings 120, anisotropically etching the layer stack 200 using the mask pattern as an etch mask to expose the first sacrificial layer SC1, and anisotropically etching the first sacrificial layer SC1 using the etched layer stack 200 as an etch mask to expose the lower insulating layer 101.

The first sacrificial layer SC1 may be used as an etch stop layer. Thus, it is possible to prevent the substrate 100 from being exposed during the anisotropically etching of the layer stack 200. In addition, the lower insulating layer 101 may also be used as an etch stop layer. Thus, it is possible to prevent the substrate 100 from being exposed during the anisotropically etching of the first sacrificial layer SC1. In an implementation, the thickness of the lower insulating layer 101 may be selected in order to help reduce the likelihood and/or prevent the substrate 100 from being exposed during the anisotropic etching of the first sacrificial layer SC1. In an implementation, a portion or region of the lower insulating layer 101 in the opening 120 may have a reduced thickness, compared with its original thickness, as shown in FIG. 13.

As a result of the formation of the openings 120, sidewalls of the first and second sacrificial layers SC1 and SC2 and the interlayer dielectrics 110 may be exposed. In addition, a horizontal width of the opening 120 may not be uniform along the vertical direction, which may be a result of the anisotropic etching process.

The openings 120 may be two-dimensionally arranged in a regular manner, and each of the openings 120 may have a cylindrical hole shape, as shown in FIG. 2. Alternatively, in plan view, each of the openings 120 may have a rectangular shape linearly elongated along a specific direction. The rectangular openings 120 may be arranged parallel to each other. In an implementation, the layer stack 200 may be cut by the openings 120. In an implementation, the openings 120 may be arranged in a zig-zag manner.

Figure 5:
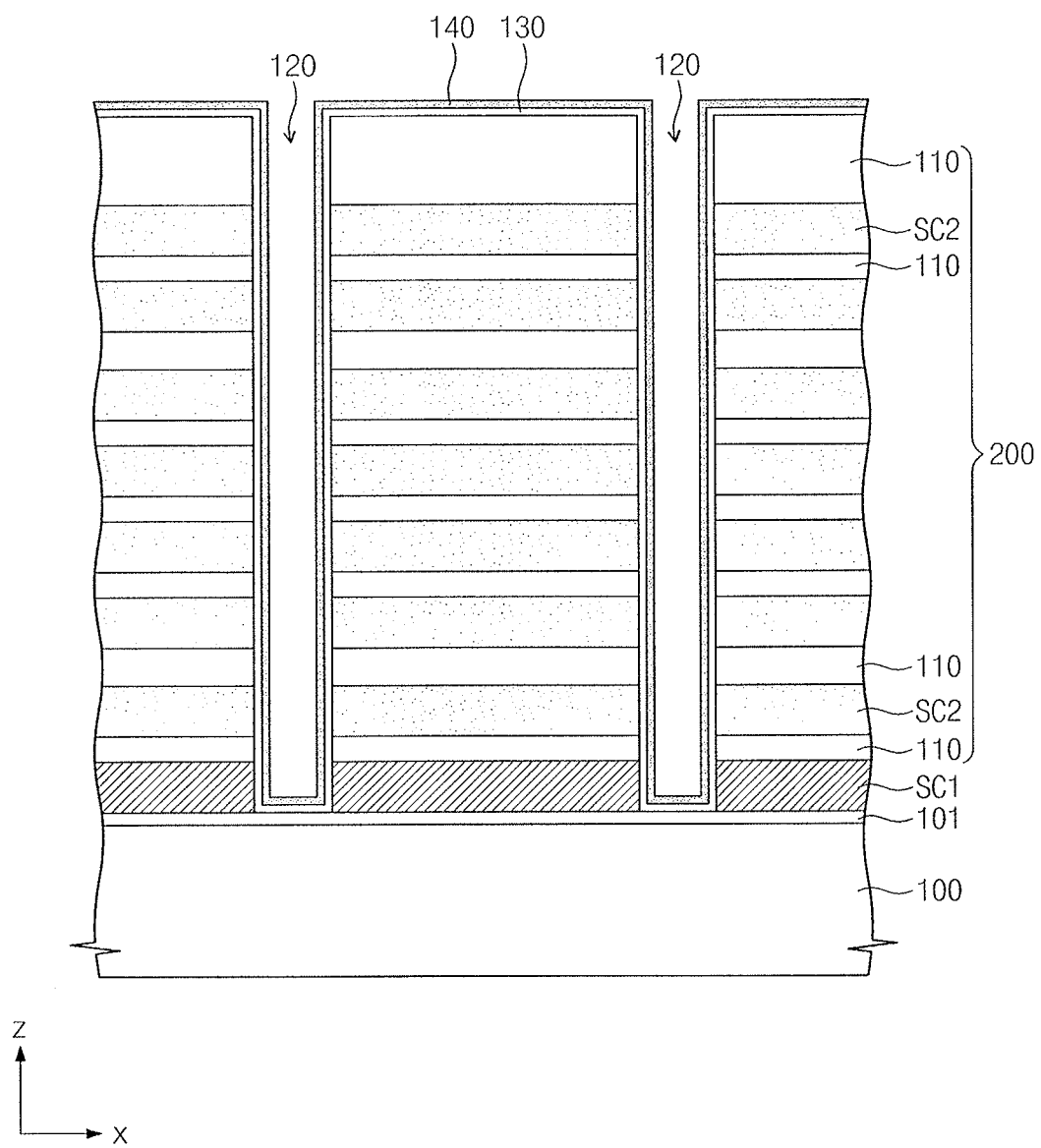

Referring to FIG. 5, a vertical insulating layer 130 and a first semiconductor layer 140 may be sequentially formed to cover inner walls of the openings 120.

The vertical insulating layer 130 and the first semiconductor layer 140 may be conformally formed so as not to completely fill the opening 120. For example, a total deposition thickness of the vertical insulating layer 130 and the first semiconductor layer 140 may be about 1/50 to 1/5 of a width of the opening 120. In an implementation, a top surface of the lower insulating layer 101 may be exposed by the openings 120. Thus, the vertical insulating layer 130 may cover the top surface of the lower insulating layer 101 exposed by the opening 120.

In an implementation, the vertical insulating layer 130 may include one or more layers. For example, the vertical insulating layer 130 may include at least one layer serving as a memory element of a charge trap type nonvolatile memory transistor. Furthermore, the vertical insulating layer 130 may be formed of an insulating material having an etch selectivity with respect to the first and second sacrificial layers SC1 and SC2. Example embodiments may be variously classified according to materials of layers constituting the vertical insulating layer 130, as will be described in more detail with reference to FIGS. 13 through 16.

In an implementation, the first semiconductor layer 140 may be a semiconductor layer (e.g., a polysilicon layer, a single-crystalline silicon layer, or an amorphous silicon layer), which may be formed by an atomic layer deposition (ALD) or a chemical vapor deposition (CVD). In an implementation, the first semiconductor layer 140 may include an organic semiconductor layer or carbon nanostructures.

Figure 6:
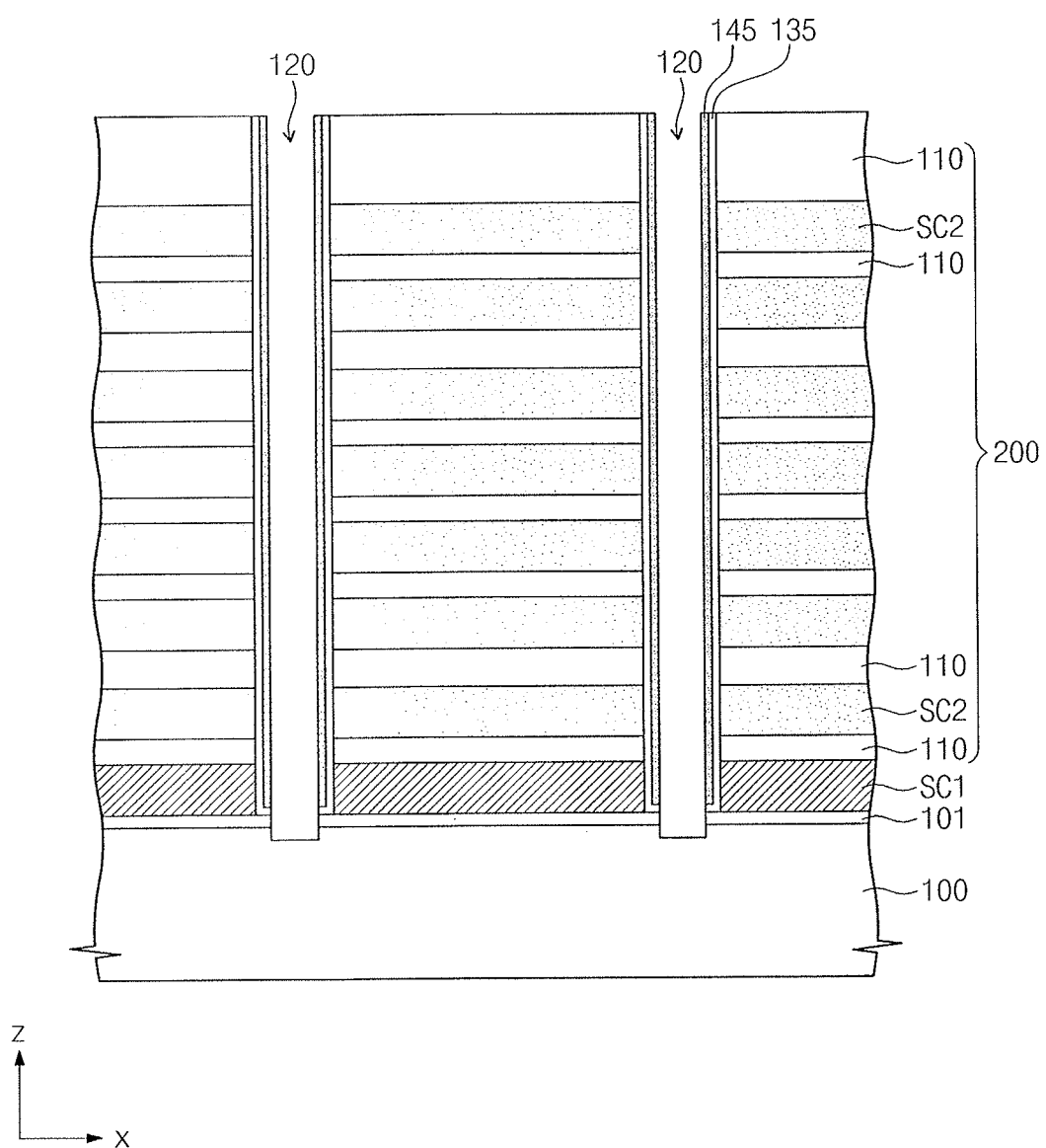

Referring to FIG. 6, portions of the first semiconductor layer 140 and the vertical insulating layer 130 covering bottom surfaces of the openings 120 may be removed to form first semiconductor patterns 145 and vertical insulating patterns 135 covering inner walls of the openings 120 and exposing a top surface of the substrate 100. The vertical insulating pattern 135 and the first semiconductor pattern 145 may have a cylindrical shell shape with open ends. In an implementation, the top surface of the substrate 100 (exposed by the vertical insulating patterns 135 and the first semiconductor pattern 145) may be over-etched during an anisotropic etching of the first semiconductor layer 140 and the vertical insulating layer 130, and may be recessed, as shown in FIG. 6.

In the anisotropic etching, a portion of the vertical insulating layer 130 under the first semiconductor pattern 145 may not be etched and, in this case, the vertical insulating pattern 135 may have a bottom portion interposed between a bottom surface of the first semiconductor pattern 145 and a top surface of the lower insulating layer 101.

The etching of the first semiconductor layer 140 and the vertical insulating layer 130 may expose a top surface of the layer stack 200. For example, each of the vertical insulating patterns 135 and each of the first semiconductor patterns 145 may be localized in corresponding ones of the openings 120. For example, the vertical insulating patterns 135 and the first semiconductor patterns 145 may be two-dimensionally arranged on the top surface (i.e., an xy plane) of the substrate 100.

Figure 7:
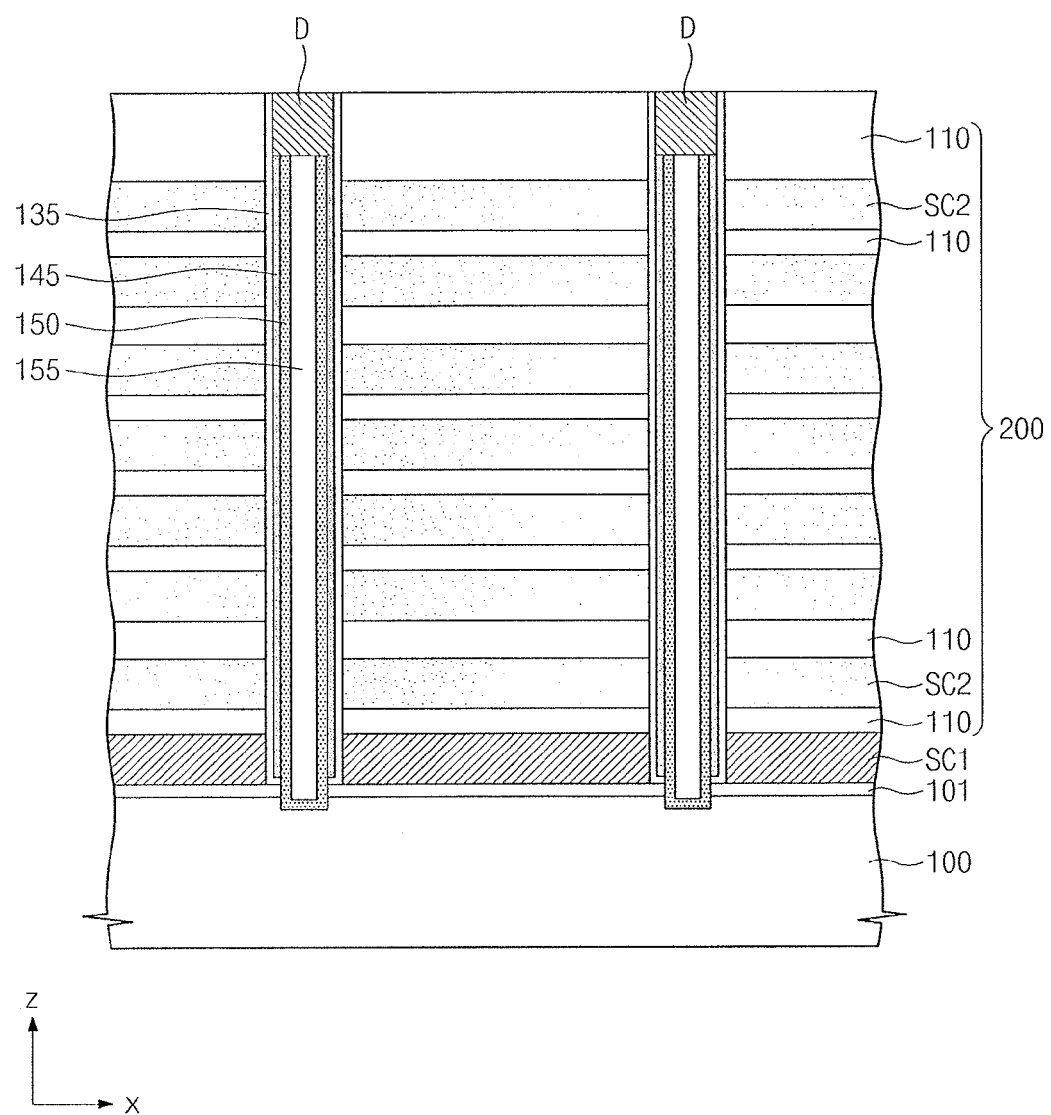

Referring to FIG. 7, a second semiconductor layer 150 and a gap-filling pattern 155 may be sequentially formed on the structure including the vertical insulating patterns 135 and the first semiconductor patterns 145.

The second semiconductor layer 150 may be a semiconductor layer (e.g., a polysilicon layer, a single-crystalline silicon layer, or an amorphous silicon layer), which may be formed by an atomic layer deposition (ALD) or a chemical vapor deposition (CVD). In an implementation, the second semiconductor layer 150 may be conformally formed to a thickness that does not completely fill the openings 120. As a result, the second semiconductor layer 150 may be formed to have, e.g., a pipe shape, a hollow cylindrical shape, or a cup shape.

The gap-filling pattern 155 may be formed to fill the openings 120 provided with or including the second semiconductor layer 150 therein. For example, the gap-filling pattern 155 may include at least one of insulating materials and silicon oxide formed by a spin-on-insulator (SOG) process. In an implementation, before the formation of the gap-filling pattern 155, a hydrogen annealing step may be further performed to thermally treat the structure including the second semiconductor layer 150 under a gas atmosphere including hydrogen and/or heavy hydrogen. Crystal defects in the first semiconductor pattern 145 and the second semiconductor layer 150 may be cured and/or reduced during the hydrogen annealing.

After the formation of the second semiconductor layer 150 and the gap-filling pattern 155, conductive pads D may be connected to upper portions of the first semiconductor pattern 145 and the second semiconductor layer 150. Forming the conductive pads D may include recessing the first semiconductor pattern 145 and the second semiconductor layer 150, and filling the recessed spaces with a conductive material. The conductive pads D may be doped with impurities having a different conductivity type from the first semiconductor pattern 145 and the second semiconductor layer 150, thereby constituting a rectifying device, e.g., a diode.

Figure 17:
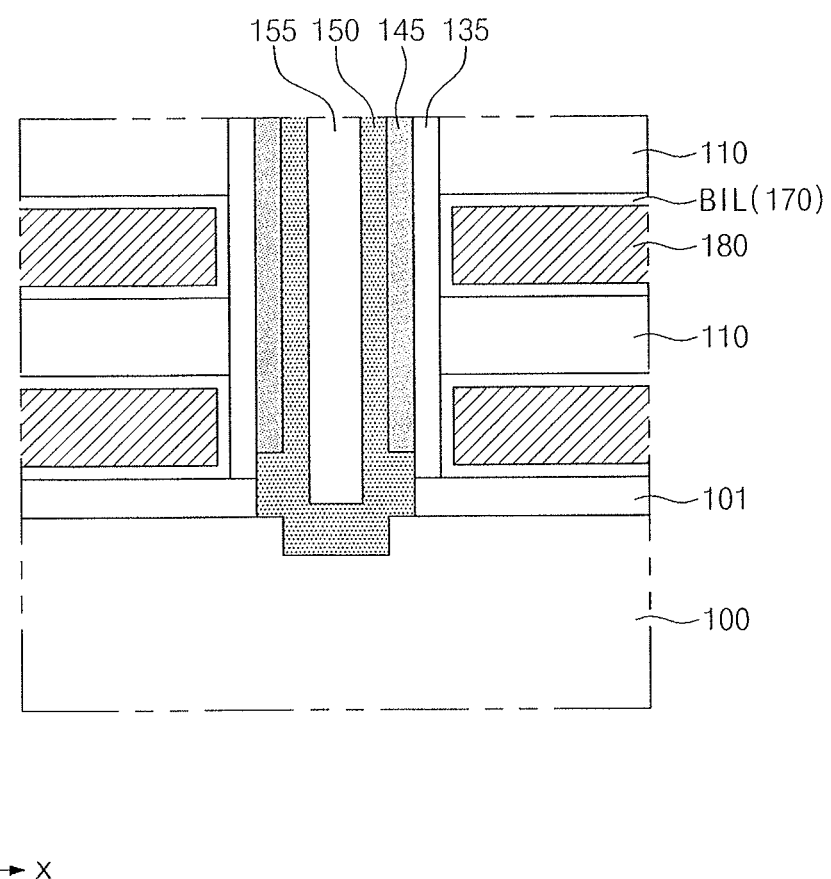

In an implementation, before the formation of the second semiconductor layer 150, the vertical insulating pattern 135 may be partially removed from a space between the bottom surface of the first semiconductor pattern 145 and the top surface of the lower insulating layer 101. The partial removal of the vertical insulating pattern 135 may be performed using an etching gas or solution having an etch selectivity with respect to the first semiconductor pattern 145. In addition, the partial removal of the vertical insulating pattern 135 may be performed so as to avoid exposing the first sacrificial layer SC1. For example, the second semiconductor layer 150 may be in direct contact with the bottom surface of the first semiconductor pattern 145, as shown in FIG. 17, while being spaced apart from the first sacrificial layer SC1 by the vertical insulating pattern 135.

Figure 8:
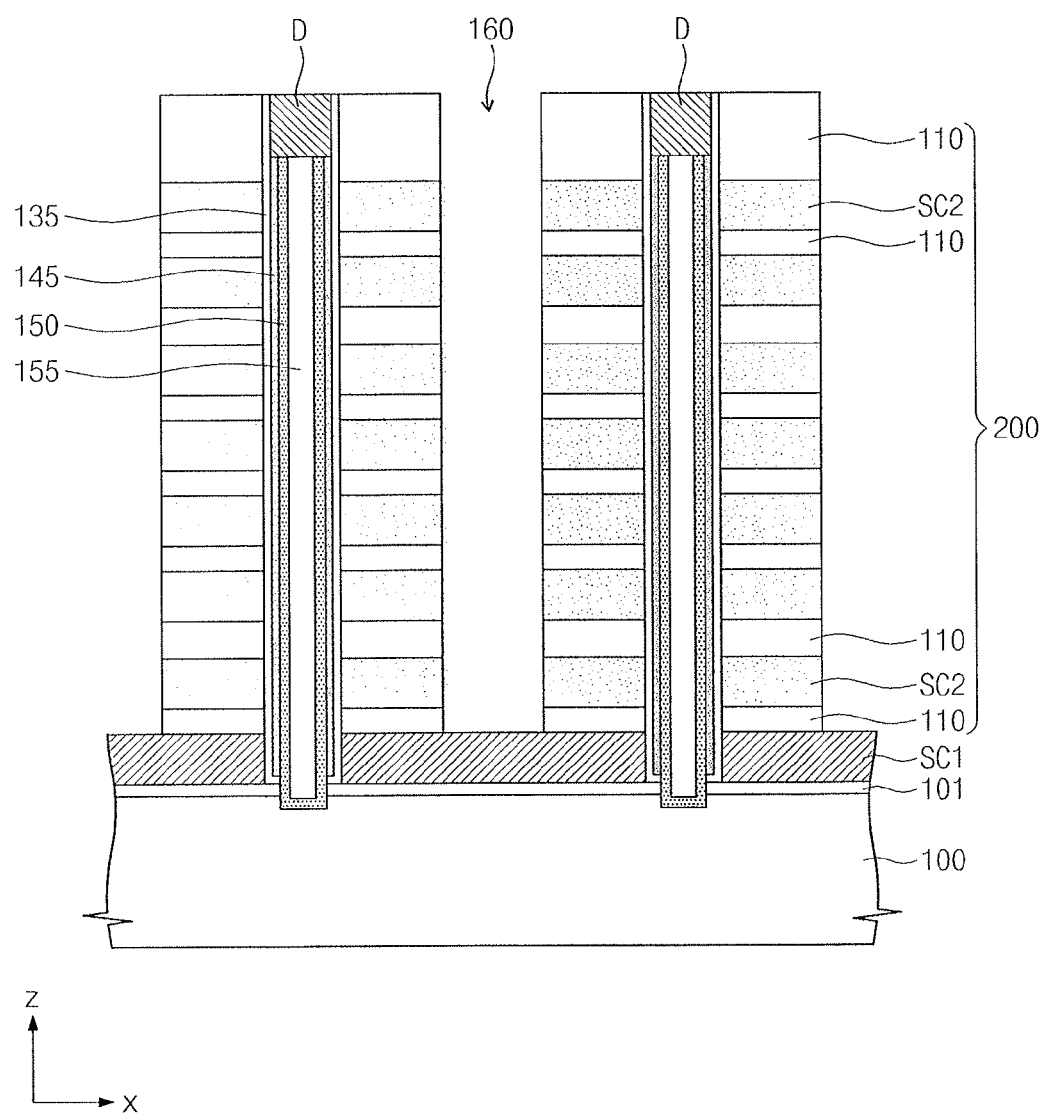

Referring to FIG. 8, the layer stack 200 may be patterned to form trenches 160 between the openings 120, e.g., the filled openings 120. The trenches 160 may expose a top surface of the first sacrificial layer SC1 and sidewalls of the second sacrificial layers SC2 and the interlayer dielectric 110.

The formation of the trenches 160 may include forming a mask pattern (not shown) on the layer stack 200 to define planar positions of the trenches 160 and then anisotropically etching the layer stack 200 using the mask pattern as an etch mask.

The trenches 160 may be spaced apart from the first semiconductor pattern 145 and may expose the sidewalls of the second sacrificial layers SC2 and the interlayer dielectrics 110. The trenches 160 may have a linear or rectangular shape in plan view and may expose the top surface of the first sacrificial layer SC1 in terms of a vertical depth. During the formation of the trenches 160, the first sacrificial layer SC1 may be used as an etch stop layer, although at least portions thereof may be vertically recessed. A horizontal width of the trench 160 may not be uniform along a vertical direction, e.g., a z-axis direction, which may be a result of the anisotropic etching process.

Due to the presence of the trenches 160, the layer stack 200 may be divided into a plurality of linear portions elongated in parallel with the trenches 160. Each of the linear portions of the layer stack 200 may be penetrated by a plurality of the first semiconductor pattern 145 and the second semiconductor layer 150.

Figure 9:
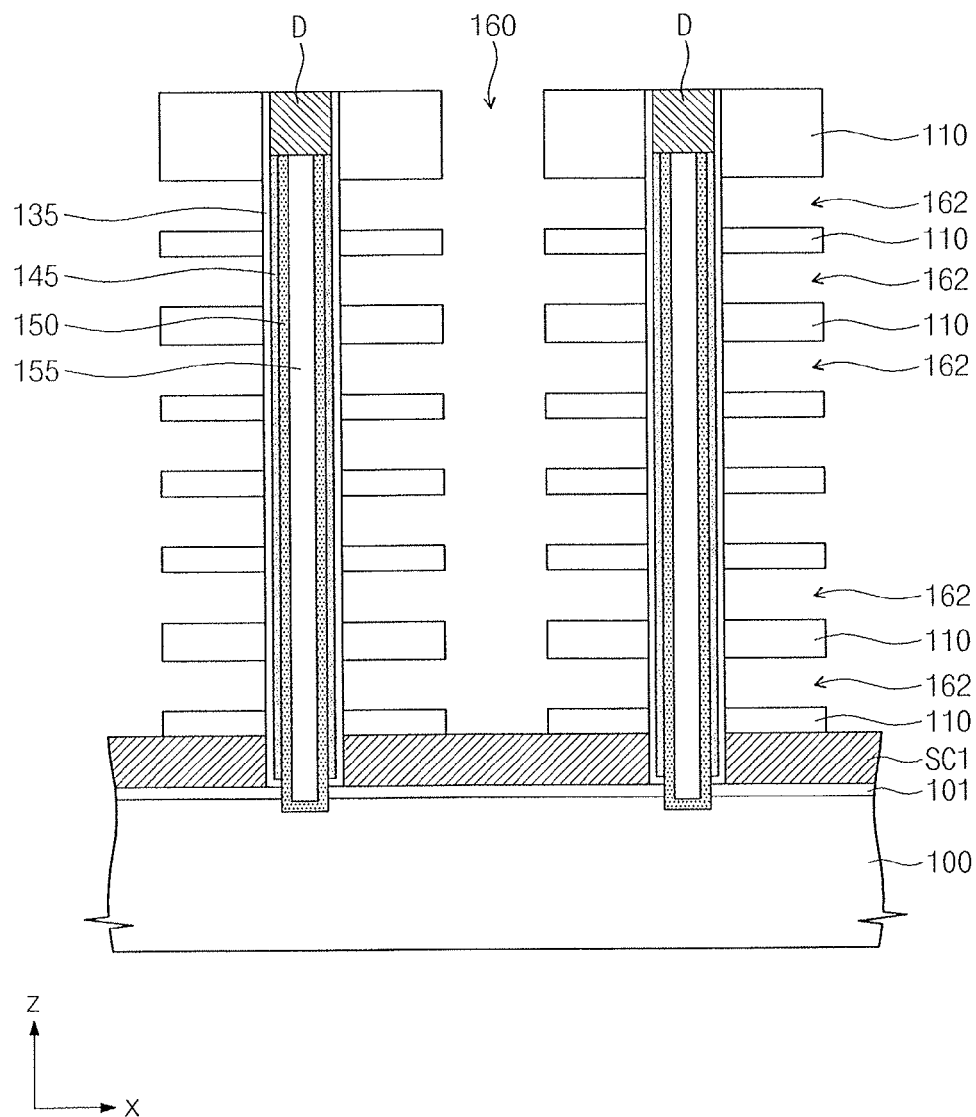

Referring to FIG. 9, the second sacrificial layers SC2 exposed by the trenches 160 may be removed to form upper recess regions 162 between the interlayer dielectrics 110.

The upper recess regions 162 may be formed by selectively removing the second sacrificial layers SC2 interposed between the interlayer dielectrics 110. The upper recess regions 162 may be gap regions extending laterally from the trenches 160 and may partially expose sidewalls of the vertical insulating pattern 135. For example, the upper recess regions 162 may be delimited by the interlayer dielectrics 110 in a vertical (e.g., z-axis) direction and by the sidewalls of the vertical insulating patterns 135 in a horizontal (e.g., x-axis) direction.

The upper recess regions 162 may be formed by isotropically etching the second sacrificial layers SC2 using an etch recipe or etchant selected to have an etch selectivity with respect to the interlayer dielectrics 110 and the first sacrificial layer SC1. The second sacrificial layers SC2 may be completely removed by the isotropic etching process. For example, when the second sacrificial layers SC2 are formed of silicon nitride and the interlayer dielectrics 110 are formed of silicon oxide, the second sacrificial layers SC2 may be removed by using an etching solution containing a phosphoric acid.

According to the embodiments, the first sacrificial layer SC1 may be formed of a material having an etch selectivity with respect to the second sacrificial layers SC2 and the interlayer dielectrics 110. Thus, the first sacrificial layer SC1 may not be removed during the formation of the upper recess regions 162.

Figure 10:
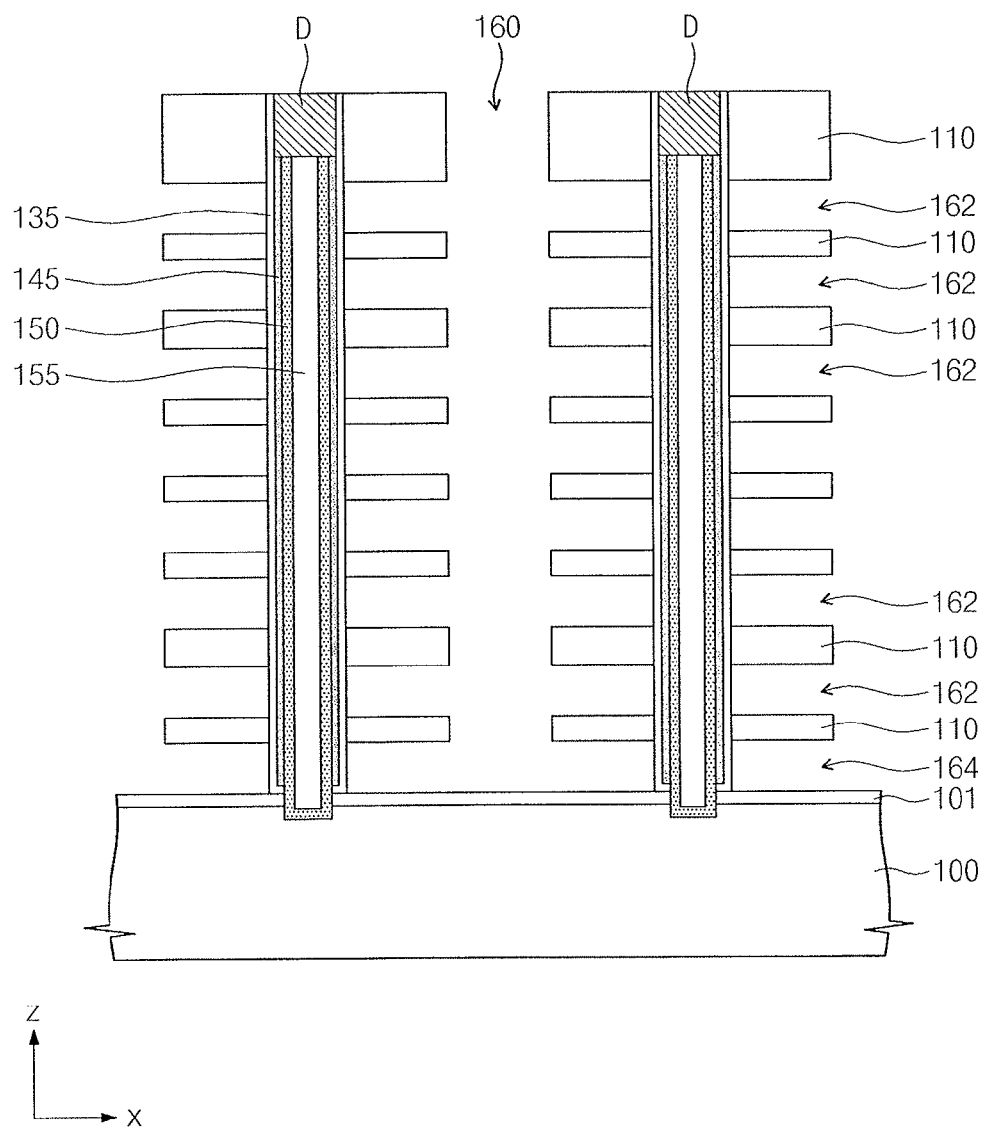

Referring to FIG. 10, the first sacrificial layer SC1 exposed by the trenches 160 may be removed to form lower recess regions 164.

The lower recess regions 164 may be formed by isotropically etching the first sacrificial layer SC1 using an etch recipe or etchant selected to have an etch selectivity with respect to the interlayer dielectrics 110 and the lower insulating layer 101. The first sacrificial layer SC1 may be completely removed by the isotropic etching process. For example, when the first sacrificial layer SC1 is formed of silicon, the first sacrificial layer SC1 may be removed by using an etching solution containing ammonia.

In an implementation, the first sacrificial layer SC1 may be formed of the same material as the first semiconductor pattern 145 and/or the second semiconductor layer 150. In this case, the presence of the vertical insulating pattern 135 may help prevent the first semiconductor pattern 145 and/or the second semiconductor layer 150 from being damaged during the formation of the lower recess region 164. In addition, the first sacrificial layer SC1 may have an etch selectivity with respect to the lower insulating layer 101 and, in this case, the lower insulating layer 101 may help prevent the substrate 100 from being damaged during the formation of the lower recess region 164. As a result, the lower recess region 164 may partially expose the sidewall of the vertical insulating pattern 135 between a lowermost interlayer dielectric 110 and the lower insulating layer 101.

Figure 11:
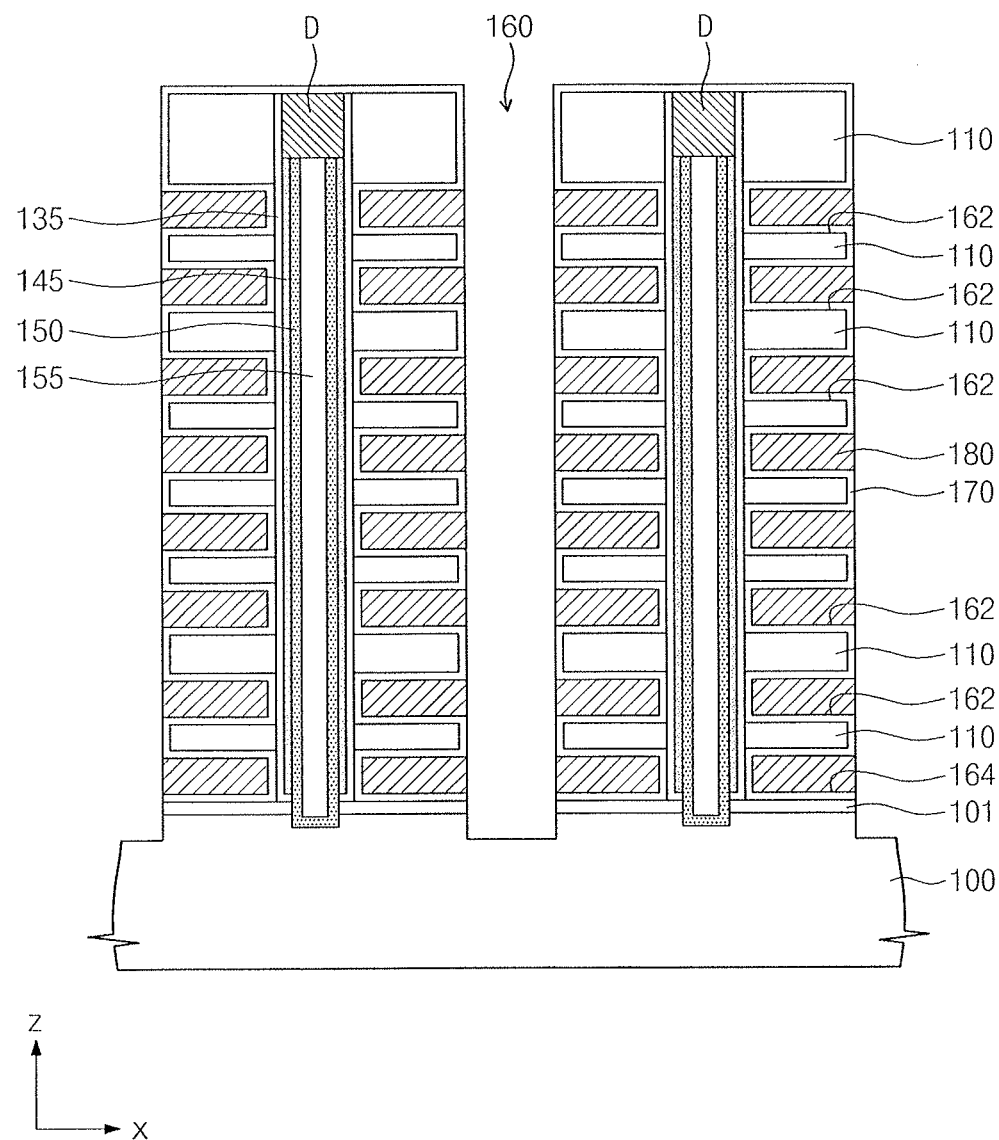

Referring to FIG. 11, a horizontal insulating layer 170 may be formed to cover inner walls of the upper and lower recess regions 162 and 164. Then, conductive patterns 180 may be formed to fill remaining spaces of the upper and lower recess regions 162 and 164.

The formation of the horizontal insulating layer 170 and the conductive patterns 180 may include sequentially forming the horizontal insulating layer 170 and a conductive layer (not illustrated) to fill the upper and lower recess regions 162 and 164, and then removing portions of the conductive layer from the trenches 160 to form the conductive patterns 180 localized within upper and lower recess regions 162 and 164.

In an implementation, similar to the vertical insulating layer 130, the horizontal insulating layer 170 may include one or more insulating layers. Furthermore, the horizontal insulating layer 170 may include a blocking insulating layer constituting a memory element of the charge trap type nonvolatile memory transistor. In an implementation, the horizontal insulating layer 170 may further include a charge storing layer and/or a tunnel insulating layer constituting a memory element of the charge trap type nonvolatile memory transistor.

The conductive layer may include at least one of a doped silicon layer, a metal layer, a metal nitride layer, and a metal silicide layer. For example, the conductive layer may include a layer of tantalum nitride or tungsten.

In an implementation, the conductive layer may conformally cover inner walls of the trenches 160 and may not completely fill the trenches 160. In this case, the formation of the conductive patterns 180 may include removing portions of conductive layer from the trenches 160 using an isotropic etching process. In an implementation, the conductive layer may fully fill the trenches 160. In this case, the formation of the conductive pattern 180 may include removing portions of the conductive layer from the trenches 160 using an anisotropic etching process. According to the present embodiments, the conductive layer may be simultaneously deposited on the upper and lower recess regions 162 and 164. Thus, the conductive patterns 180 in the upper recess regions 162 may be formed of the same material as those in the lower recess regions 164.

In an implementation, a horizontal distance (e.g., a distance in an x-axis direction) between the conductive pattern 180 and the first semiconductor pattern 145 may be substantially the same, e.g., uniform, in both the lower recess region 164 and in the upper recess region 162, because it may be uniquely determined by a horizontal thickness of the vertical insulating pattern 135.

Figure 12:
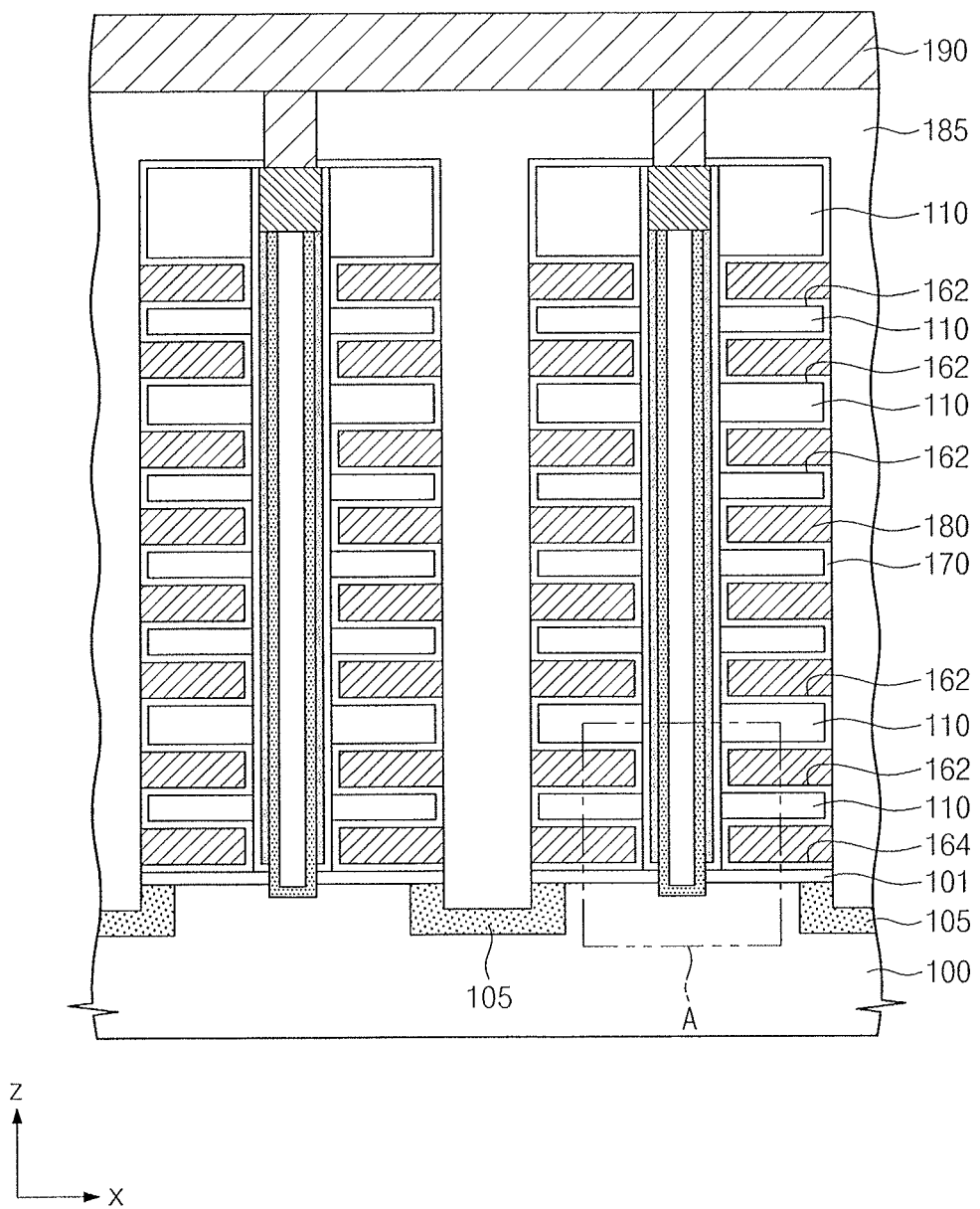
Figure 13:
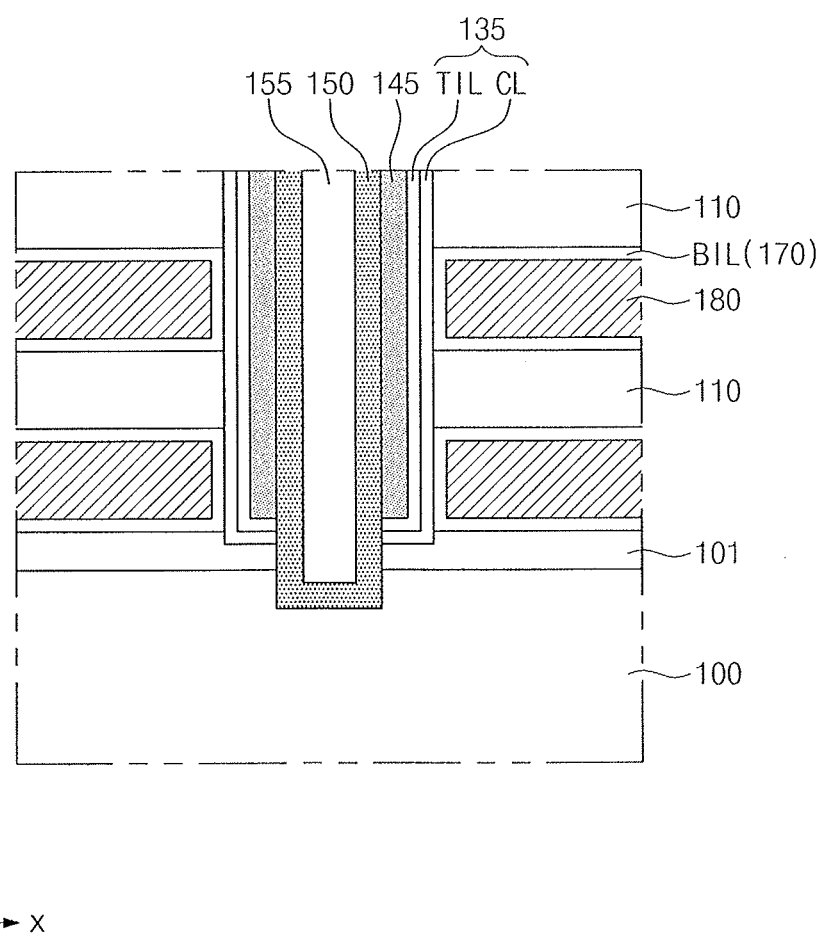
FIG. 13 illustrates an enlarged sectional view of a portion A of FIG. 12.

Referring to FIG. 12, doped regions 105 may be formed in the substrate 100, after the formation of the conductive patterns 180. The doped regions 105 may be formed in portions of the substrate 100 exposed by the trenches 160, using an ion implantation process. In an implementation, the doped regions 105 may serve as a common source line of a NAND FLASH memory device.

The doped regions 105 may have a different conductivity type from the substrate 100, such that the doped regions 105 and the substrate 100 may form pn diodes. By contrast, the second semiconductor layer 150 (e.g., a bottom portion thereof) may have the same conductivity type as a region (hereinafter, contact region) of the substrate 100 positioned thereunder.

In an implementation, the doped regions 105 may be connected to each other and may be in an equipotential state. In an implementation, the doped regions 105 may be electrically separated from each other, such that they may have electric potentials different from each other. In an implementation, the doped regions 105 may be separated into a plurality of source groups including a plurality of the doped regions 105, and the source groups may be electrically separated from each other to be at different electric potentials.

Referring to FIG. 12, electrode separation patterns 185 may be formed to fill the trenches 160, upper plugs may be formed on the conductive pads D, respectively, and then, upper interconnection lines 190 may be formed to connect the upper plugs with each other.

The electrode separation patterns 185 may be formed of at least one of silicon oxide, silicon nitride, and silicon oxynitride. The upper plugs may be formed of at least one of doped silicon and metallic materials.

Each of the upper interconnection lines 190 may be electrically connected to the first semiconductor pattern 145 and/or the second semiconductor layer 150 via the upper plugs and may cross the conductive patterns 180 or the trenches 160. In an example of this embodiment as applied to the fabrication of a flash memory, the upper interconnection lines 190 may serve as bit lines connected to upper end portions of a plurality of cell strings.

The three-dimensional semiconductor device according to an embodiment may be a nonvolatile memory device. For example, the horizontal insulating layer 170 and the vertical insulating pattern 135 may serve as a memory element (hereinafter, a data storing layer) capable of storing information. For example, the horizontal insulating layer 170 and the vertical insulating pattern 135 may constitute a data storing layer for the memory cell transistor of the charge trap type nonvolatile memory device. As will be described in more detail with reference to FIGS. 13 through 17, below, embodiments may be variously classified according to a number or materials of layers constituting the horizontal insulating layer 170 and the vertical insulating pattern 135.

Figure 14:
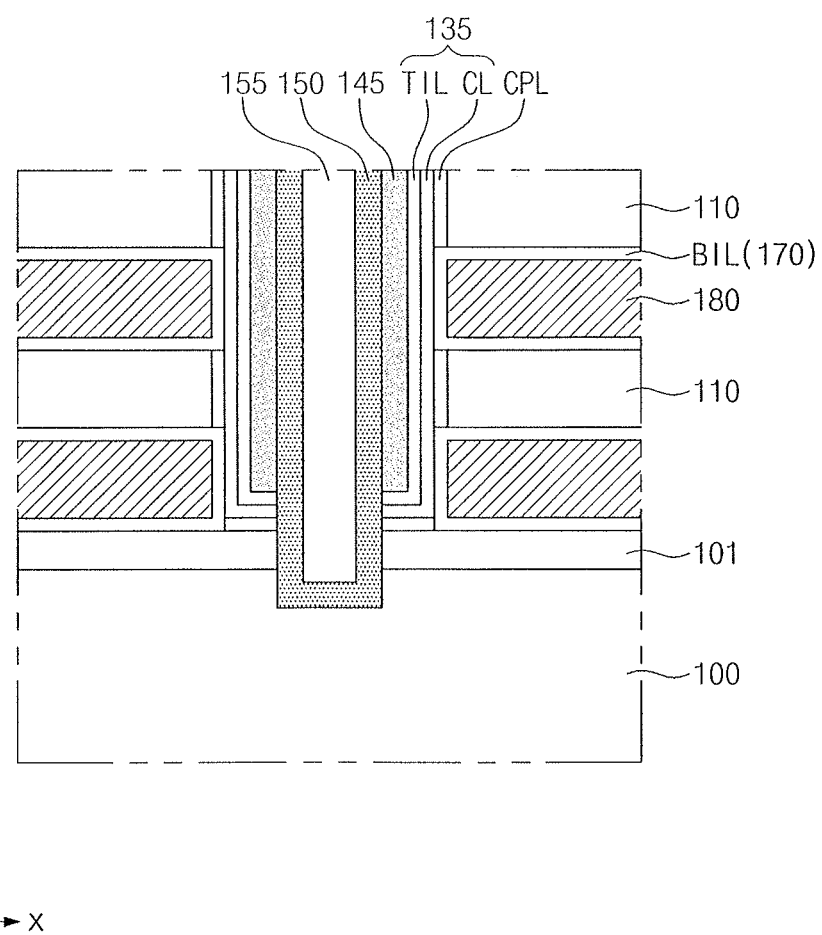
FIGS. 14 through 17 illustrate sectional views of portions of three-dimensional semiconductor devices according to an embodiment.
Figure 15:
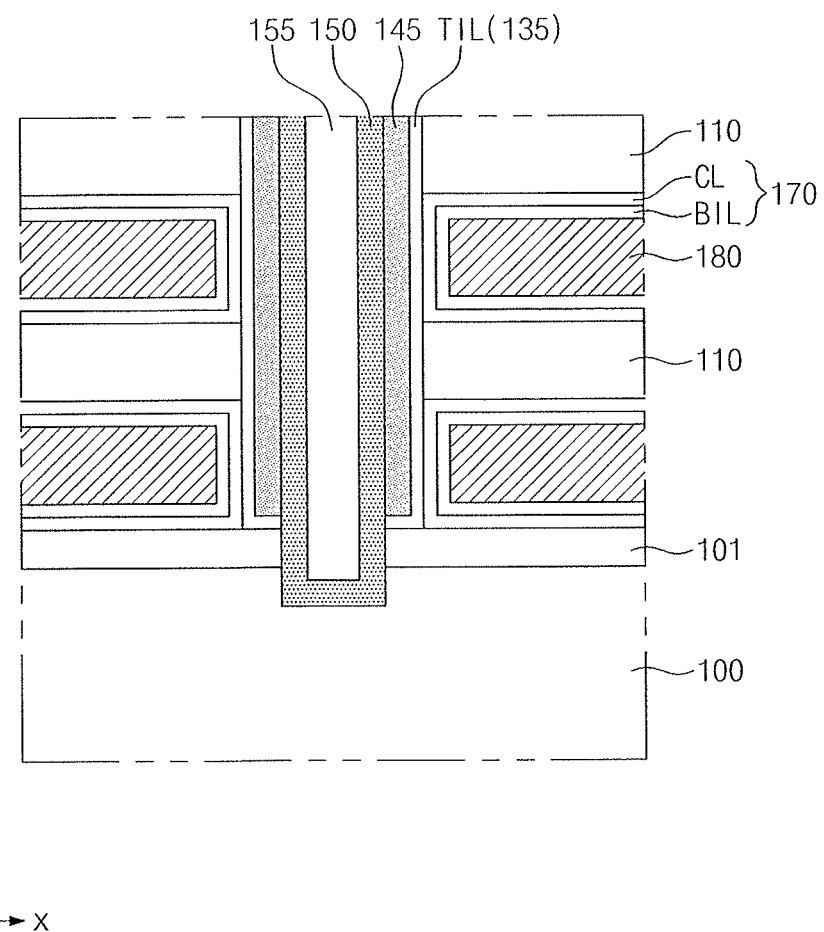
Figure 16:
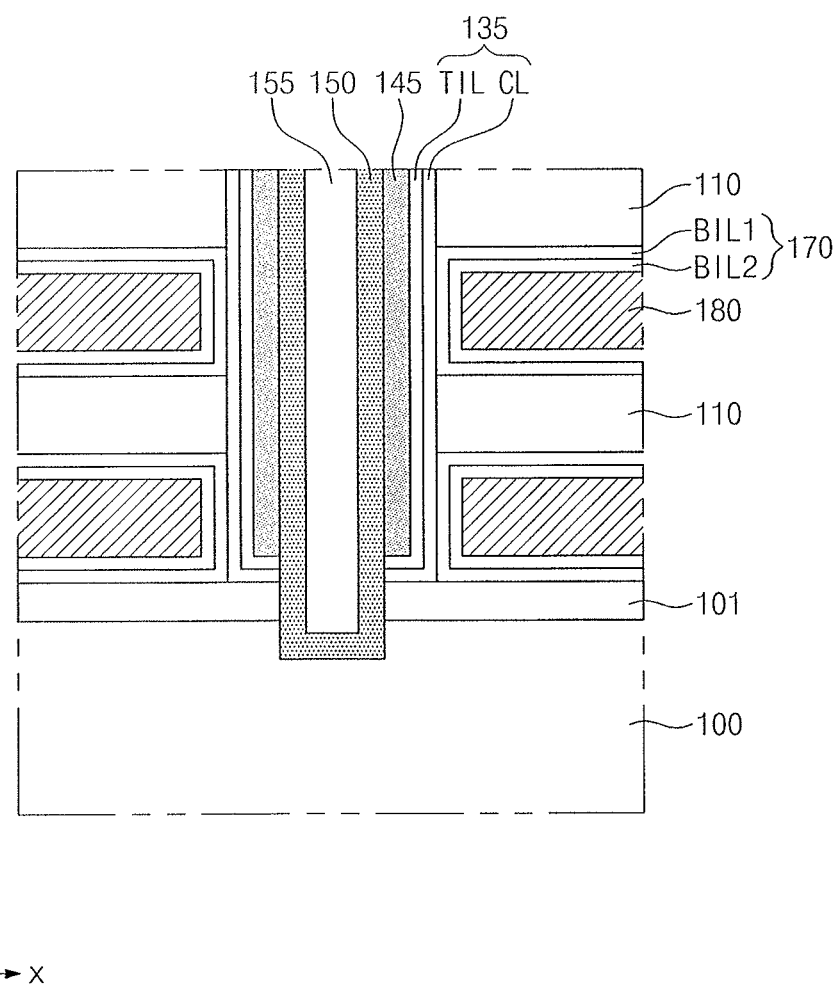

As shown in FIGS. 13 to 17, the data storing layer may include a tunnel insulating layer TIL, a charge storing layer CL, and a blocking layer BIL. In an implementation, the data storing layer may further include a capping layer CPL interposed between the charge storing layer CL and the interlayer dielectric 110 in the horizontal (e.g., x-axis) direction or between the blocking layers BIL in the vertical (e.g., z-axis) direction, as shown in FIG. 14. The blocking layer BIL may include a first blocking layer BIL1 and a second blocking layer BIL2, as shown in FIG. 16.

Layers of the data storing layer may be formed using a deposition technique providing, e.g., excellent and/or improved step coverage property (such as a CVD and/or ALD technique). In an implementation, each of the tunnel insulating layer TIL, the charge storing layer CL, and the blocking layer BIL may be formed by a single deposition step to have a single-layer structure. In an implementation, at least one of the tunnel insulating layer TIL, the charge storing layer CL, and the blocking layer BIL may be formed by several deposition steps to have a multi-layered structure.

The charge storing layer CL may include one or more insulating layers with abundant trap sites and/or one or more insulating layers with nanoparticles. For example, the charge storing layer CL may include one of a trap insulating layer, a floating gate electrode, and/or an insulating layer with conductive nanodots. The charge storing layer CL may include at least one of a silicon nitride layer, a silicon oxynitride layer, a silicon-rich nitride layer, a nanocrystalline silicon layer, and/or a laminated trap layer.

The tunnel insulating layer TIL may include a material with a higher band gap than the charge storing layer CL. For example, the tunnel insulating layer TIL may include a silicon oxide layer or a silicon oxynitride layer. The tunnel insulating layer TIL may undergo a thermal treatment after a deposition process. The thermal treatment process may include, e.g., a rapid thermal nitridation (RTN) process and/or an annealing process under an atmosphere including nitrogen and/or oxygen.

The blocking layer BIL may include a material having a smaller band gap than the tunnel insulating layer TIL and a larger band gap than the charge storing layer CL. For example, the blocking layer BIL may include a high-k dielectric layer (e.g., an aluminum oxide layer and/or a hafnium oxide layer). As a result, the blocking layer BIL may have a greater dielectric constant than the tunnel insulating layer TIL.

As shown in FIG. 13, the vertical insulating pattern 135 may include the tunnel insulating layer TIL and the charge storing layer CL, and the horizontal insulating layer 170 may include the blocking insulation layer BIL. As previously described with reference to FIG. 16, the blocking insulation layer BIL may include the first and second blocking insulation layers BIL1 and BIL2. In this case, the first and second blocking layers BIL1 and BIL2 may include different materials. In addition, one of the first and second blocking layers BIL1 and BIL2 may include a material having a smaller band gap than the tunnel insulating layer TIL and a larger band gap than the charge storing layer CL and having a greater dielectric constant than the other. For example, one of the first and second blocking layers BIL1 and BIL2 may be formed of a high-k dielectric layer (e.g., an aluminum oxide layer and/or a hafnium oxide layer), and the other may be formed of silicon oxide. As a result, an effective dielectric constant of the first and second blocking layers BIL1 and BIL2 may be greater than that of the tunnel insulating layer TIL.

As previously described with reference to FIG. 14, the vertical insulating pattern 135 may include the capping layer CPL adjacent to the interlayer dielectric 110. The capping layer CPL may include a material having an etch selectivity with respect to the charge storing layer CL and/or the first and second sacrificial layers SC1 and SC2. For example, the capping layer CPL may include a silicon oxide layer or an aluminum oxide layer. The capping layer CPL may be formed on inner walls of the openings 120, after the formation of the openings 120 described with reference to FIG. 4. In this case, the capping layer CPL may serve as an etch stop layer during removal of the first and second sacrificial layers SC1 and SC2.

Therefore, it is possible to help prevent the charge storing layer CL from being damaged during the formation of the upper and lower recess regions 162 and 164 described with reference to FIG. 10.

Although not depicted in the drawings, the capping layer CPL may be interposed between the conductive pattern 180 and the charge storing layer CL. In this case, the capping layer CPL may include one of silicon oxide and/or high-k dielectrics and may help prevent electric charges from being unintentionally emitted from the charge storing layer CL (e.g., back-tunneling).

As shown in FIG. 15, the vertical insulating pattern 135 may include the tunnel insulating layer TIL, and the horizontal insulating layer 170 may include the charge storing layer CL and the blocking insulation layer BIL.

The three-dimensional semiconductor device according to an embodiment may be a variable resistance memory device, such as a phase changeable random access memory (PCRAM), a resistive RAM (ReRAM), or a magnetic RAM (MRAM). For example, at least one of the vertical insulating pattern 135 and horizontal insulating layer 170 may include at least one of phase changeable materials, perovskite materials, transition metal oxides, magnetic materials, ferromagnetic materials, or antiferromagnetic materials.

Figure 18:
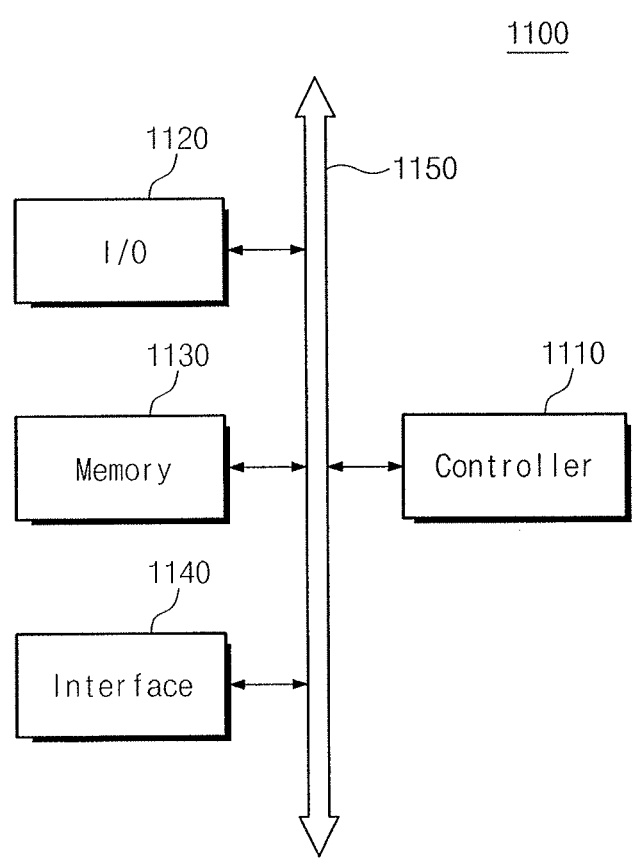
FIG. 18 illustrates a block diagram of a memory system including a three-dimensional semiconductor device according to an embodiment.

FIG. 18 illustrates a block diagram of a memory system including a three-dimensional semiconductor device according to an embodiment.

Referring to FIG. 18, a memory system 1100 may be applied to, e.g., a personal digital assistant (PDA), a portable computer, a web tablet, a wireless phone, a mobile phone, a digital music player, a memory card, and/or all the devices that transmit and/or receive data in a wireless communication environment.

The memory system 1100 may include a controller 1110, an input/output device 1120 such as a keypad and a display device, a memory 1130, an interface 1140, and a bus 1150. The memory 1130 and the interface 1140 may communicate with each other through the bus 1150.

The controller 1110 may include at least one microprocessor, at least one digital signal processor, at least one micro controller, or other process devices similar to the microprocessor, the digital signal processor, and the micro controller. The memory 1130 may be used to store an instruction executed by the controller 1110. The input/output device 1120 may receive data or a signal from outside of the system 1100 or may transmit data or a signal to the outside of the system 1100. For example, the input/output device 1120 may include a keyboard, a keypad, and/or a display.

The memory 1130 may include at least one of the three-dimensional semiconductor devices according to an embodiment. The memory 1130 may further include a different kind of memory, a volatile memory device capable of random access, and various kinds of memories.

The interface 1140 may transmit data to a communication network or may receive data from a communication network.

Furthermore, a three-dimensional semiconductor device according to an embodiment or a memory system including the same may be packaged in various kinds of ways. For example, the three-dimensional semiconductor device or the memory system may be employed in a Package on Package (PoP), Ball Grid Array (BGA), Chip Scale Package (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), or Wafer-level Processed Stack Package (WSP). The package in which the three-dimensional semiconductor device according to an embodiment is mounted may further include at least one semiconductor device (e.g., a controller and/or a logic device) that controls the three-dimensional semiconductor device.

Figure 19:
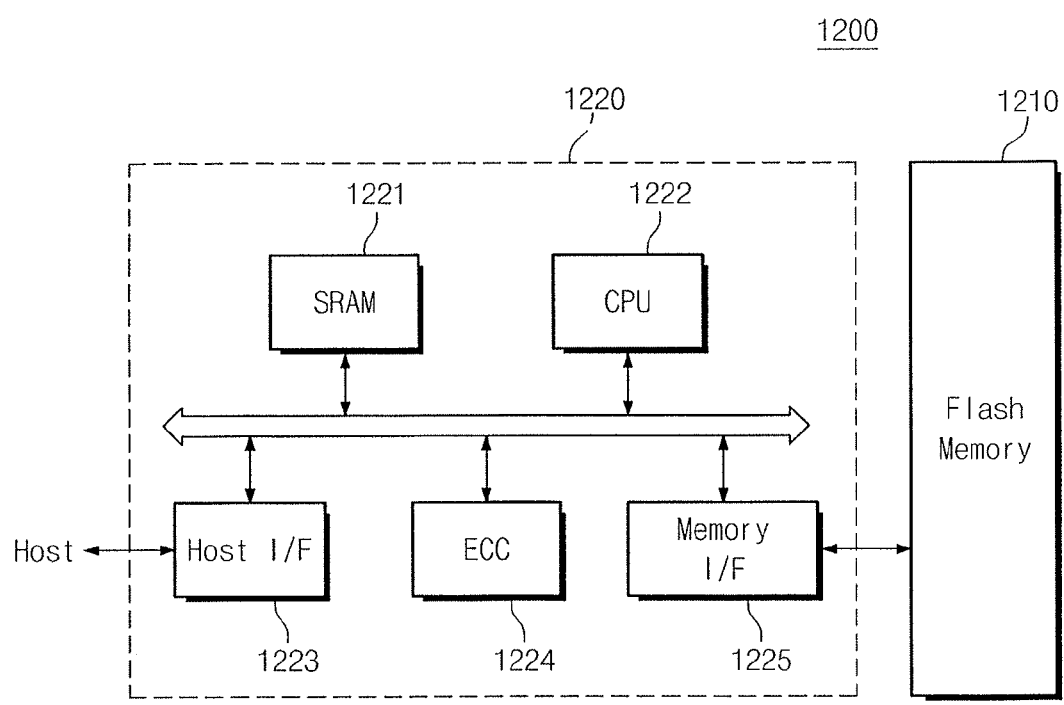
FIG. 19 illustrates a block diagram of a memory card including a three-dimensional semiconductor device according to an embodiment.

FIG. 19 illustrates a block diagram of a memory card including a three-dimensional semiconductor device according to an embodiment.

Referring to FIG. 19, the memory card 1200 for supporting a storage capability of a large capacity may be fitted with a semiconductor memory device 1210, which may be the three-dimensional semiconductors according to an embodiment. The memory card 1200 may include a memory controller 1220 controlling every data exchange between a host and the semiconductor memory device 1210.

A static random access memory (SRAM) 1221 may be used as an operation memory of a processing unit 1222. A host interface 1223 may include data exchange protocols of a host to be connected to the memory card 1200. An error correction block 1224 may detect and correct errors included in data readout from a multi bit semiconductor memory device 1210. A memory interface 1225 may interface with the semiconductor memory device 1210. The processing unit 1222 may perform every control operation for exchanging data of the memory controller 1220. Even though not depicted in drawings, the memory card 1200 according to an embodiment may further include a ROM ((not shown)) storing code data for interfacing with the host.

Figure 20:
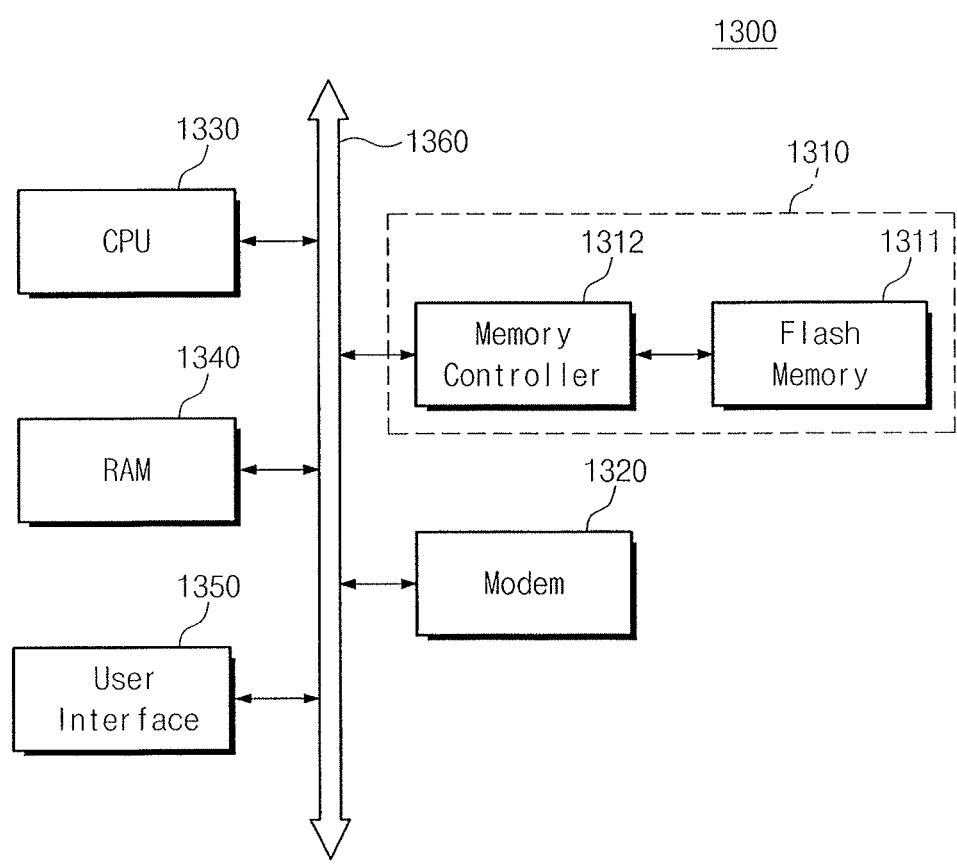
FIG. 20 illustrates a block diagram of an information processing system including a three-dimensional semiconductor device according to an embodiment.

FIG. 20 illustrates a block diagram of an information processing system including a three-dimensional semiconductor device according to an embodiment.

Referring to FIG. 20, an information processing system 1300 may be realized using a memory system 1310 including at least one of the three-dimensional semiconductor devices according to an embodiment. For example, the information processing system 1300 may include a mobile device and/or a desktop computer. In an implementation, the information processing system 1300 may further include a modem 1320, a central processing unit (CPU) 1330, a random access memory (RAM) 1340, and a user interface 1350, which may be electrically connected to a system bus 1360, in addition to the memory system 1310. The memory system 1310 may include a memory device 1311 and a memory controller 1312. In an implementation, the memory system 1310 may be configured to be substantially identical to the memory card 1200 described with respect to FIG. 19. Data processed by the CPU 1330 and/or input from the outside may be stored in the memory system 1310. In an implementation, the memory system 1310 may be used as a portion of a solid state drive (SSD) and, in this case, the information processing system 1300 may stably and reliably store a large amount of data in the memory system 1310. Although not illustrated, an application chipset, a camera image sensor, a camera image signal processor (ISP), an input/output device, or the like may further be included in the information processing system 1300 according to an embodiment.

By way of summation and review, three-dimensional semiconductor memory devices having three-dimensionally arranged memory cells have been considered. In order to mass-produce three-dimensional semiconductor memory devices, process technology should provide a lower manufacturing cost per bit than two-dimensional memory devices while maintaining or exceeding a level of reliability associated therewith.

The formation of 3D NAND FLASH memory may include forming a mold structure, in which insulating layers and sacrificial layers are alternately stacked on a substrate, and patterning the mold structure to form an opening exposing the substrate through the mold structure. However, a top surface of the substrate may be recessed by an over-etching during the formation of the opening. Then, dielectric and semiconductor layers may be sequentially formed in the opening. The semiconductor layer is connected to the substrate through the dielectric layer. Due to the recess of the substrate, the dielectric layer in the opening may have a portion extending into the recess of the substrate and have a bottom surface lower than the top surface of the substrate.

Due to the presence of the extending portion of the dielectric layer, an inversion region may not be formed near the extending portion. Accordingly, a cell current may be reduced. Thus, it may be desirable to prevent the dielectric layer from extending into the recess of the substrate. For example, after the formation of the dielectric layer, a portion of the dielectric layer adjacent to the substrate may be removed using a wet etching process. However, such a wet-etching method may result in poor etching uniformity. In an alternative approach, a polysilicon layer may be used in place of the lowermost sacrificial layer (formed of, e.g., silicon nitride). However, resistance of a ground selection line may increase, because the polysilicon layer will be used as the ground selection line in the final structure.

According to an embodiment, a vertical insulating pattern may not be inserted into a substrate while being formed, e.g., penetrating an electrode structure including conductive patterns sequentially stacked on the substrate. For example, the vertical insulating pattern may be spaced apart from a top surface of the substrate. This may help prevent a roundabout current path from being formed, because a semiconductor pattern and a doped region forming the current path may be electrically connected to each other without any interruption. Accordingly, it is possible to suppress reduction of a cell current flowing between the semiconductor pattern and the doped region during an operation of the three-dimensional semiconductor device.

Embodiments provide three-dimensional semiconductor devices with improved reliability and productivity.

The embodiments also provide methods of fabricating a three dimensional semiconductor memory device with improved reliability and productivity.

Furthermore, according to an embodiment, the conductive patterns in the electrodes structure may be formed of the same metallic material. This may help reduce resistance of the conductive patterns as well as a fabricating cost.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a three-dimensional semiconductor device, the method comprising:
    sequentially forming a lower insulating layer and a first sacrificial layer on a substrate;
    forming a layer stack on the first sacrificial layer such that the layer stack includes alternately stacked interlayer dielectrics and second sacrificial layers, the interlayer dielectrics and the second sacrificial layers having an etch selectivity with respect to the first sacrificial layer;
    patterning the layer stack to form a trench exposing the first sacrificial layer;
    selectively removing the second sacrificial layers exposed by the trench to form upper recess regions between the interlayer dielectrics;
    selectively removing the first sacrificial layer exposed by the trench to form a lower recess region between the lower insulating layer and a lowermost one of the interlayer dielectrics; and
    forming conductive patterns in the lower and upper recess regions.

2. The method as claimed in claim 1, further comprising, prior to forming the trench,
    forming an opening that penetrates the layer stack and the first sacrificial layer and exposes the lower insulating layer;
    sequentially forming a vertical insulating layer and a first semiconductor layer to cover an inner wall of the opening; and
    forming a second semiconductor layer penetrating the first semiconductor layer, the vertical insulating layer, and the lower insulating layer at a bottom of the opening such that the second semiconductor layer is connected to the substrate.

3. The method as claimed in claim 2, wherein the first sacrificial layer is formed of a substantially same material as the first and second semiconductor layers.

4. The method as claimed in claim 2, wherein the upper and lower recess regions partially expose a sidewall of the vertical insulating layer.

5. The method as claimed in claim 1, wherein forming the lower recess region exposes a top surface of the lower insulating layer.

6. The method as claimed in claim 1, further comprising, prior to forming the conductive patterns, conformally forming a horizontal insulating layer in the lower and upper recess regions.

* * * * *